(12) United States Patent
Hattori et al.

(10) Patent No.: US 10,741,331 B2
(45) Date of Patent: *Aug. 11, 2020

(54) COMPOSITE ELECTRONIC COMPONENT AND RESISTOR

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/372,469

(22) Filed: Apr. 2, 2019

(65) Prior Publication Data

US 2019/0228914 A1 Jul. 25, 2019

Related U.S. Application Data

(62) Division of application No. 15/042,236, filed on Feb. 12, 2016, now Pat. No. 10,290,427.

(30) Foreign Application Priority Data

Mar. 12, 2015 (JP) .................................. 2015-049457

(51) Int. Cl.
*H01G 4/40* (2006.01)
*H01C 1/14* (2006.01)
(Continued)

(52) U.S. Cl.
CPC .............. *H01G 4/40* (2013.01); *H01C 1/012* (2013.01); *H01C 1/14* (2013.01); *H05K 1/181* (2013.01);
(Continued)

(58) Field of Classification Search
CPC .................... H01C 1/012; H01C 1/142; H01C 17/003–006; H01C 17/231; H01G 2/14; H01G 4/12; H01G 4/30; H01G 4/40
(Continued)

(56) References Cited

U.S. PATENT DOCUMENTS 6,856,234 B2 * 2/2005 Kuriyama .............. H01C 1/142
338/309
8,284,016 B2 * 10/2012 Ryu ....................... H01C 1/034
338/307
(Continued)

OTHER PUBLICATIONS

Hattori et al., "Composite Electronic Component and Resistor", U.S. Appl. No. 15/042,236, filed Feb. 12, 2016.
(Continued)

*Primary Examiner* — Tuan T Dinh
(74) *Attorney, Agent, or Firm* — Keating & Bennett, LLP

(57) ABSTRACT

A composite electronic component includes a capacitor and a resistor stacked in a height direction. The capacitor includes a capacitor body, and first and second external electrodes. The resistor includes a base portion, a resistor, first and second upper surface conductors, first and second lower surface conductors, first connecting conductors, and second connecting conductors. An upper surface of the base portion of the resistor faces a lower surface of the capacitor body of the capacitor, and the first upper surface conductor and the first external electrode are electrically connected, and the second upper surface conductor and the second external electrode are electrically connected.

4 Claims, 16 Drawing Sheets

(51) Int. Cl.
*H01C 1/012* (2006.01)
*H05K 1/18* (2006.01)

(52) U.S. Cl.
CPC .............. *H05K 2201/10015* (2013.01); *H05K 2201/10022* (2013.01); *H05K 2201/1053* (2013.01); *H05K 2201/10636* (2013.01); *Y02P 70/611* (2015.11)

(58) Field of Classification Search
USPC ......... 361/301–306, 790, 803; 338/307–307, 338/312–332
See application file for complete search history.

(56) References Cited

U.S. PATENT DOCUMENTS

| | | | |
|---|---|---|---|
| 9,236,844 B2 * | 1/2016 | Feichtinger | H01G 4/40 |
| 2009/0115569 A1 * | 5/2009 | Urano | H01C 1/012 |
| | | | 338/309 |
| 2010/0157505 A1 * | 6/2010 | Feichtinger | H01G 4/30 |
| | | | 361/301.4 |
| 2014/0124256 A1 * | 5/2014 | Hattori et al. | H01G 2/065 |
| | | | 174/260 |
| 2014/0313682 A1 * | 10/2014 | Mitome | H05K 3/3452 |
| | | | 361/767 |
| 2015/0340154 A1 * | 11/2015 | Kim | H01G 2/14 |
| | | | 174/260 |

OTHER PUBLICATIONS

Hattori et al., "Composite Electronic Component and Resistor", U.S. Appl. No. 16/372.468, filed Apr. 2, 2019.

* cited by examiner

COMPOSITE ELECTRONIC COMPONENT AND RESISTOR

BACKGROUND OF THE INVENTION

1. Field of the Invention

The present invention relates to a composite electronic component including a resistor and a capacitor, and a resistor included in the composite electronic component.

2. Description of the Related Art

Conventionally, a variety of composite electronic components having both a resistor (R) and a capacitor C have been proposed from the view point of achieving high integration of electronic components on a wiring substrate.

For example, JP-A 2001-338838 discloses a composite electronic component in which a resistor is disposed on the outer surface of a capacitor body of a chip capacitor, and the resistor is connected with a pair of external electrodes disposed on the outer surface of the capacitor body, and thus the resistor and the capacitor are electrically connected.

JP-A 6-283301 discloses a composite electronic component in which two or more rectangular parallelepiped chip elements having the same shape and the same dimension selected from the group consisting of a chip resistor, a chip thermistor, a chip capacitor and a chip varistor are overlapped with one another in the thickness direction of these elements, and terminal electrodes provided in these elements are collectively covered with a lead frame to integrate the same.

However, the composite electronic component disclosed in JP-A 2001-338838, in which a resistor is formed directly on the surface of the capacitor body, is difficult to form and process during production, and also a problem arises that the electric characteristics of the resistor are restricted by the size of the capacitor body and the shape, the size and the like of the pair of external electrodes provided in the capacitor body, and thus the degree of freedom in design for the composite electronic component is extremely low.

Also, since the composite electronic component disclosed in JP-A 6-283301 requires forming various chip elements to be composited into rectangular parallelepipeds of the same shape and the same size, the electric characteristics of the individual chip elements are also restricted to a certain extent corresponding to this, and the problem of the low degree of freedom in design arises for the composite electronic component.

Both of the composite electronic components disclosed in JP-A 2001-338838 and JP-A 2001-338838 are limited to a structure such that the resistor (R) and the capacitor C are electrically connected in parallel, so that the degree of freedom in design is greatly limited in terms of the circuit design, and use of these composite electronic components is necessarily limited to specific circuits.

SUMMARY OF THE INVENTION

Preferred embodiments of the present invention provide a composite electronic component facilitating combination of a resistor and a capacitor having desired electric characteristics, and thus having improved degree of freedom in design, and a resistor provided in the same.

A composite electronic component according to a preferred embodiment of the present invention includes a resistor, and a capacitor mounted on the resistor in a height direction. The resistor includes an insulating base portion including an upper surface and a lower surface that are opposite to each other in the height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, and a second connecting conductor connecting the second upper surface conductor and the second lower surface conductor. The capacitor includes a capacitor body including a lower surface intersecting the height direction, and a first external electrode and a second external electrode disposed on the outer surface of the capacitor body in such a manner that they are separated from each other in the length direction. In the composite electronic component according to a preferred embodiment of the present invention, the upper surface of the base portion and the lower surface of the capacitor body face each other in the height direction, and the first upper surface conductor and the first external electrode are electrically connected, and the second upper surface conductor and the second external electrode are electrically connected.

In a first aspect of a composite electronic component according to a preferred embodiment of the present invention, the resistor is disposed on the upper surface of the base portion, and is located between the first upper surface conductor and the second upper surface conductor in the length direction. In this case, the resistor includes a third upper surface conductor and a fourth upper surface conductor disposed on the upper surface of the base portion, located between the first upper surface conductor and the second upper surface conductor in the length direction in such a manner that they are separated from each other, a third lower surface conductor and a fourth lower surface conductor disposed on the lower surface of the base portion, located between the first lower surface conductor and the second lower surface conductor in the length direction in such a manner that they are separated from each other, a third connecting conductor connecting the third upper surface conductor and the third lower surface conductor, and a fourth connecting conductor connecting the fourth upper surface conductor and the fourth lower surface conductor, and the third upper surface conductor and the fourth upper surface conductor may be connected by the resistor.

In the first aspect, the third upper surface conductor and the fourth upper surface conductor may be separated from each other in a width direction that is perpendicular or substantially perpendicular to the height direction and the length direction.

In the first aspect, the third upper surface conductor and the fourth upper surface conductor may be separated from each other in the length direction.

In the first aspect, at least one of the third connecting conductor and the fourth connecting conductor may include an internal connecting conductor extending in the direction perpendicular or substantially perpendicular to the height direction inside the base portion, an upper via conductor connected to the internal connecting conductor, which is located between the upper surface of the base portion and the internal connecting conductor and extending in the height direction, and a lower via conductor connected to the internal connecting conductor, which is located between the lower surface of the base portion and the internal connecting conductor and extending in the height direction, and in this case, the upper via conductor and the lower via conductor may not overlap each other at least partially when viewed along the height direction.

In a second aspect of a composite electronic component according to a preferred embodiment of the present invention, the resistor is disposed on the upper surface of the base portion. In this case, the resistor further includes a third upper surface conductor disposed on the upper surface of the base portion, and located between the first upper surface conductor and the second upper surface conductor in the length direction, a third lower surface conductor disposed on the lower surface of the base portion, and located between the first lower surface conductor and the second lower surface conductor in the length direction and a third connecting conductor connecting the third upper surface conductor and the third lower surface conductor, and the first upper surface conductor and the third upper surface conductor may be connected by the resistor.

In the second aspect, the third connecting conductor may include an internal connecting conductor extending in the direction perpendicular or substantially perpendicular to the height direction inside the base portion, an upper via conductor connected to the internal connecting conductor, which is located between the upper surface of the base portion and the internal connecting conductor and extending in the height direction, a lower via conductor connected to the internal connecting conductor, which is located between the lower surface of the base portion and the internal connecting conductor and extending in the height direction, and in this case, the upper via conductor and the lower via conductor may not overlap each other at least partially when viewed along the height direction.

In a third aspect of a composite electronic component according to a preferred embodiment of the present invention, the resistor is disposed on the upper surface of the base portion. In this case, the first upper surface conductor and the second upper surface conductor may be connected by the resistor.

In the first to third aspects, a maximum height of the resistor based on of the upper surface of the base portion may be larger than a maximum height of the first upper surface conductor and the second upper surface conductor.

In the first to third aspects, preferably, the resistor further includes a protective film that covers the resistor.

In the first to third aspects, a maximum height of the protective film based on the upper surface of the base portion may be larger than a maximum height of each of the first upper surface conductor and the second upper surface conductor.

In a fourth aspect of a composite electronic component according to a preferred embodiment of the present invention, the resistor is disposed on the lower surface of the base portion, and is located between the first lower surface conductor and the second lower surface conductor in the length direction. In this case, the resistor further includes a third lower surface conductor and a fourth lower surface conductor disposed on the lower surface of the base portion, located between the first lower surface conductor and the second lower surface conductor in the length direction in such a manner that they are separated from each other, and the third lower surface conductor and the fourth lower surface conductor may be connected by the resistor.

In the fourth aspect, the third lower surface conductor and the fourth lower surface conductor may be separated from each other in a width direction that is perpendicular or substantially perpendicular to the height direction and the length direction.

In a fifth aspect of a composite electronic component according to a preferred embodiment of the present invention, the resistor is disposed on the lower surface of the base portion. In this case, the resistor further includes a third lower surface conductor disposed on the lower surface of the base portion, which is located between the first lower surface conductor and the second lower surface conductor in the length direction, and the first lower surface conductor and the third lower surface conductor may be connected by the resistor.

In a sixth aspect of a composite electronic component according to a preferred embodiment of the present invention, the resistor is disposed on the lower surface of the base portion. In this case, the first lower surface conductor and the second lower surface conductor may be connected by the resistor.

In the fourth to sixth aspects, preferably, the resistor further includes a protective film that covers the resistor.

In a seventh aspect of a composite electronic component according to a preferred embodiment of the present invention, the resistor is embedded inside the base portion, and is located between the first connecting conductor and the second connecting conductor in the length direction. In this case, the resistor further includes a first internal conductor and a second internal conductor embedded inside the base portion, located between the first connecting conductor and the second connecting conductor in the length direction in such a manner that they are separated from each other, a third lower surface conductor and a fourth lower surface conductor disposed on the lower surface of the base portion, located between the first lower surface conductor and the second lower surface conductor in the length direction in such a manner that they are separated from each other, a third connecting conductor connecting the first internal conductor and the third lower surface conductor, and a fourth connecting conductor connecting the second internal conductor and the fourth lower surface conductor, and the first internal conductor and the second internal conductor may be connected by the resistor.

In the seventh aspect, the first internal conductor and the second internal conductor may be separated from each other in a width direction that is perpendicular or substantially perpendicular to the height direction and the length direction.

In the seventh aspect, the first internal conductor and the second internal conductor may be separated from each other in the length direction.

A resistor according to the first aspect of various preferred embodiments of the present invention includes an insulating base portion including an upper surface and a lower surface that are opposite to each other in a height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, a second connecting conductor connecting the second upper surface conductor and the second lower surface conductor, a third upper surface conductor and a fourth upper surface conductor disposed on the upper surface of the base portion, located between the first upper surface conductor and the second upper surface conductor in the length direction in such a manner that they are separated from each other, a third lower surface conductor and a fourth lower surface conductor disposed on the lower surface of the base portion, located between the first lower surface conductor and the second lower surface conductor in the length direction in such a manner that they are separated from each other, a third connecting conductor connecting the third upper surface conductor and the third lower surface conductor, and a fourth connecting conductor connecting the fourth upper surface conductor and the fourth lower surface conductor. The resistor is disposed on the upper surface of the base portion, and is located between the first upper surface conductor and the second upper surface conductor in the length direction. In the resistor according to the first aspect of various preferred embodiments of the present invention, the third upper surface conductor and the fourth upper surface conductor are connected by the resistor.

In the resistor according to the first aspect of various preferred embodiments of the present invention, the third upper surface conductor and the fourth upper surface conductor may be separated from each other in a width direction that is perpendicular or substantially perpendicular to the height direction and the length direction.

In the resistor according to the first aspect of various preferred embodiments of the present invention, the third upper surface conductor and the fourth upper surface conductor may be separated from each other in the length direction.

In the resistor according to the first aspect of various preferred embodiments of the present invention, at least one of the third connecting conductor and the fourth connecting conductor may include an internal connecting conductor extending in the direction perpendicular or substantially perpendicular to the height direction inside the base portion, an upper via conductor connected to the internal connecting conductor, which is located between the upper surface of the base portion and the internal connecting conductor and extending in the height direction, and a lower via conductor connected to the internal connecting conductor, which is located between the lower surface of the base portion and the internal connecting conductor and extending in the height direction, and in this case, the upper via conductor and the lower via conductor may not overlap each other at least partially when viewed along the height direction.

A resistor according to the second aspect of various preferred embodiments of the present invention includes an insulating base portion including an upper surface and a lower surface that are opposite to each other in a height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, a second connecting conductor connecting the second upper surface conductor and the second lower surface conductor, a third upper surface conductor disposed on the upper surface of the base portion, and located between the first upper surface conductor and the second upper surface conductor in the length direction, a third lower surface conductor disposed on the lower surface of the base portion, and located between the first lower surface conductor and the second lower surface conductor in the length direction and a third connecting conductor connecting the third upper surface conductor and the third lower surface conductor. The resistor is disposed on the upper surface of the base portion. In the resistor according to the second aspect of various preferred embodiments of the present invention, the first upper surface conductor and the third upper surface conductor are connected by the resistor.

In the resistor according to the second aspect of various preferred embodiments of the present invention, the third connecting conductor may include an internal connecting conductor extending in the direction perpendicular or substantially perpendicular to the height direction inside the base portion, an upper via conductor connected to the internal connecting conductor, which is located between the upper surface of the base portion and the internal connecting conductor and extending in the height direction, a lower via conductor connected to the internal connecting conductor, which is located between the lower surface of the base portion and the internal connecting conductor and extending in the height direction, and in this case, the upper via conductor and the lower via conductor may not overlap each other at least partially when viewed along the height direction.

In the resistor according to the first or second aspect of various preferred embodiments of the present invention, a maximum height of the resistor based on the upper surface of the base portion may be larger than a maximum height of each of the first upper surface conductor and the second upper surface conductor.

Preferably, the resistor according to the first or second aspect of various preferred embodiments of the present invention further includes a protective film that covers the resistor.

In the resistor according to the first or second aspect of various preferred embodiments of the present invention, a maximum height of the protective film based on the upper surface of the base portion may be larger than a maximum height of the first upper surface conductor and the second upper surface conductor.

A resistor according to the third aspect of various preferred embodiments of the present invention includes an insulating base portion including an upper surface and a lower surface that are opposite to each other in a height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, a second connecting conductor connecting the second upper surface conductor and the second lower surface conductor, and a third lower surface conductor and a fourth lower surface conductor disposed on the lower surface of the base portion, located between the first lower surface conductor and the second lower surface conductor in the length direction in such a manner that they are separated from each other. The resistor is disposed on the lower surface of the base portion, and is located between the first lower surface conductor and the second lower surface conductor in the length direction. In the resistor according to the third aspect of various preferred embodiments of the present invention, the third lower surface conductor and the fourth lower surface conductor are connected by the resistor.

In the resistor according to the third aspect of various preferred embodiments of the present invention, the third lower surface conductor and the fourth lower surface conductor may be separated from each other in a width direction that is perpendicular or substantially perpendicular to the height direction and the length direction.

A resistor according to the fourth aspect of various preferred embodiments of the present invention includes an insulating base portion including an upper surface and a lower surface that are opposite to each other in a height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, a second connecting conductor connecting the second upper surface conductor and the second lower surface conductor, and a third lower surface conductor disposed on the lower surface of the base portion, which is located between the first lower surface conductor and the second lower surface conductor in the length direction. The resistor is disposed on the lower surface of the base portion. In the resistor according to the fourth aspect of various preferred embodiments of the present invention, the first lower surface conductor and the third lower surface conductor are connected by the resistor.

Preferably, the resistor according to the third or fourth aspect of various preferred embodiments of the present invention further includes a protective film that covers the resistor.

A resistor according to the fifth aspect of various preferred embodiments of the present invention includes an insulating base portion including an upper surface and a lower surface that are opposite to each other in a height direction, a resistor provided in the base portion, a first upper surface conductor and a second upper surface conductor disposed on the upper surface of the base portion in such a manner that they are separated from each other in a length direction perpendicular or substantially perpendicular to the height direction, a first lower surface conductor and a second lower surface conductor disposed on the lower surface of the base portion in such a manner that they are separated from each other in the length direction, a first connecting conductor connecting the first upper surface conductor and the first lower surface conductor, a second connecting conductor connecting the second upper surface conductor and the second lower surface conductor, a first internal conductor and a second internal conductor embedded inside the base portion, located between the first connecting conductor and the second connecting conductor in the length direction in such a manner that they are separated from each other, a third lower surface conductor and a fourth lower surface conductor disposed on the lower surface of the base portion, located between the first lower surface conductor and the second lower surface conductor in the length direction in such a manner that they are separated from each other, a third connecting conductor connecting the first internal conductor and the third lower surface conductor, and a fourth connecting conductor connecting the second internal conductor and the fourth lower surface conductor. The resistor is embedded inside the base portion, and is located between the first connecting conductor and the second connecting conductor in the length direction.

In the resistor according to the fifth aspect of various preferred embodiments of the present invention, the first internal conductor and the second internal conductor are connected by the resistor.

In the resistor according to the fifth aspect of various preferred embodiments of the present invention, the first internal conductor and the second internal conductor may be separated from each other in a width direction that is perpendicular or substantially perpendicular to the height direction and the length direction.

In the resistor according to the fifth aspect of various preferred embodiments of the present invention, the first internal conductor and the second internal conductor may be separated from each other in the length direction.

According to various preferred embodiments of the present invention, it is possible to provide a composite electronic component facilitating combination of a resistor and a capacitor having desired electric characteristics and thus having improved degree of freedom in design, and a resistor provided therein.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be specifically described by referring to attached drawings. It is to be noted that in the following preferred embodiments, the same or a common structural element or feature is denoted by the same reference sign in different drawings and the description thereof will not be repeated.

Preferred Embodiment 1

Figure 1:
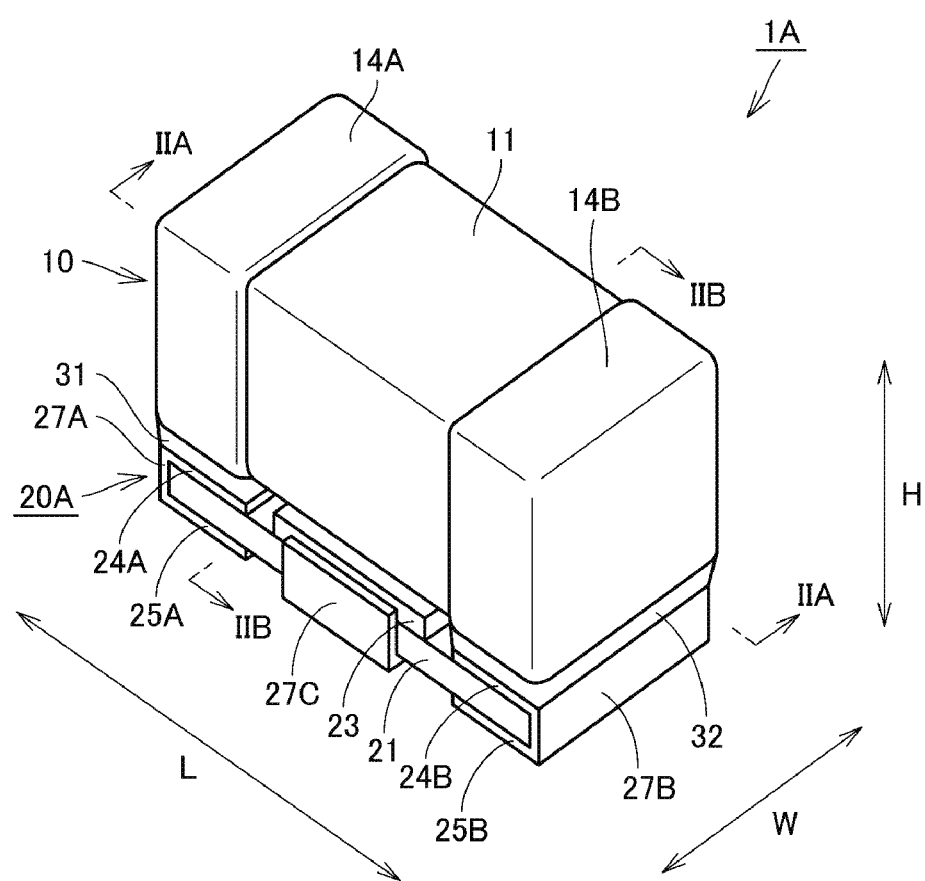
FIG. 1 is a schematic perspective view of a composite electronic component in Preferred Embodiment 1 of the present invention.
Figure 2A:
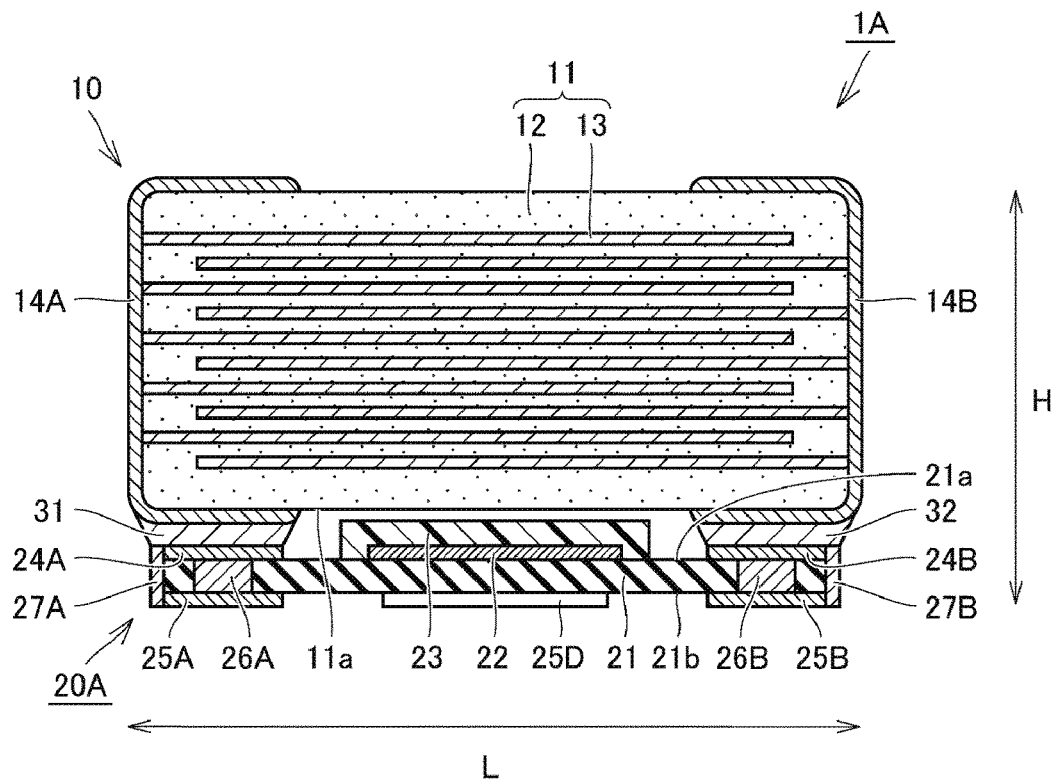
FIGS. 2A and 2B are schematic perspective views along the line IIA-IIA and the line IIB-IIB shown in FIG. 1.
Figure 2B:
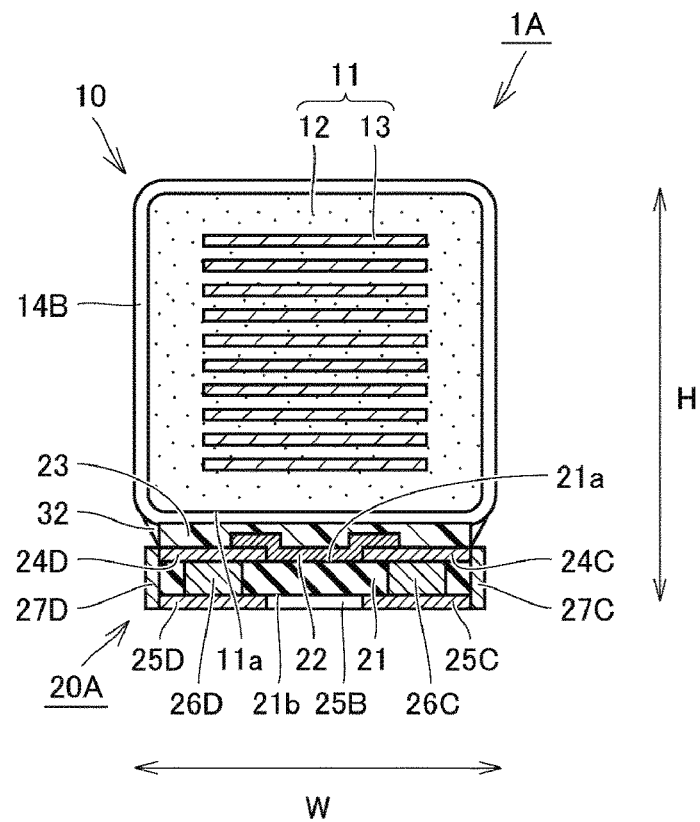
Figure 3A:
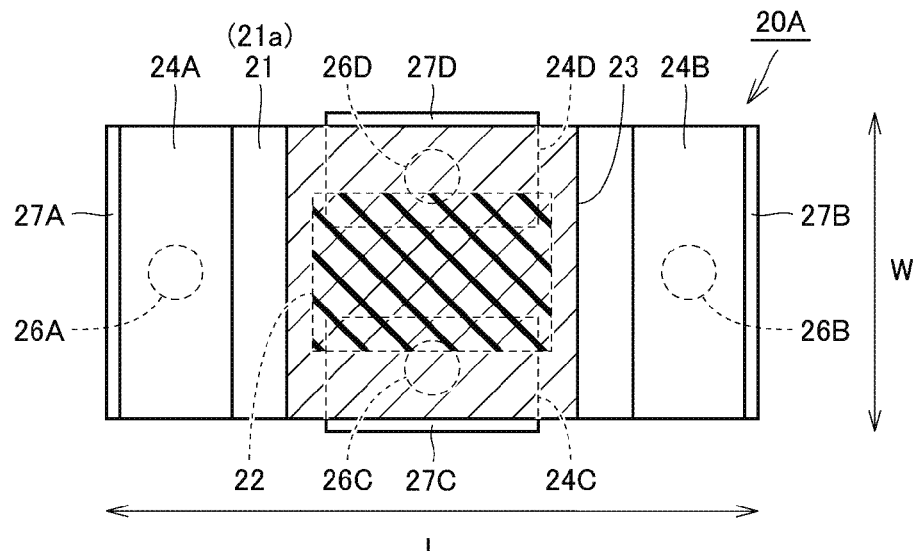
FIGS. 3A and 3B are a top view and a bottom view of the resistor shown in FIG. 1.
Figure 3B:
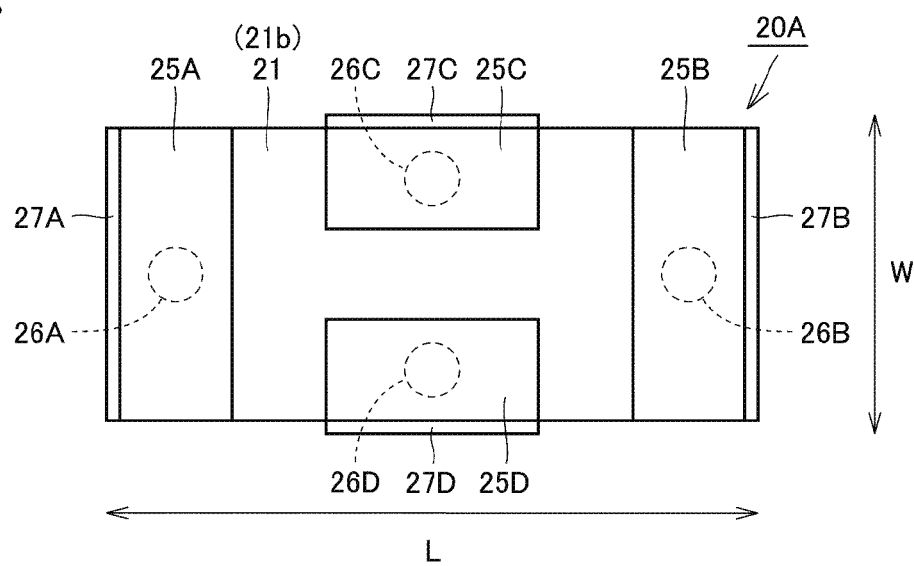
Figure 4:
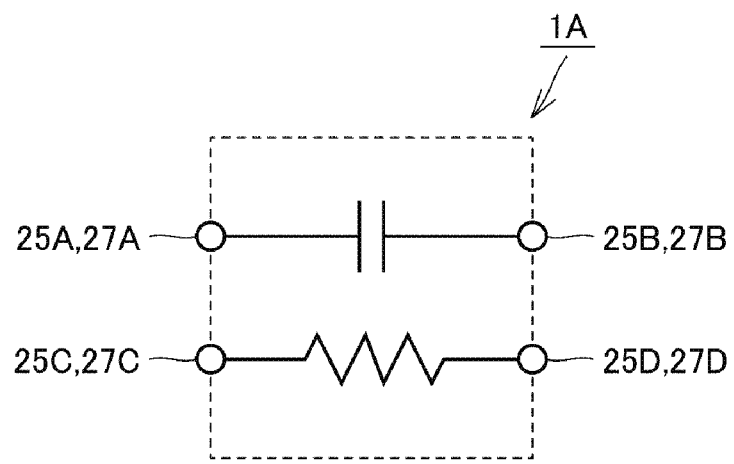
FIG. 4 is a view showing an equivalent circuit of the composite electronic component shown in FIG. 1.

FIG. 1 is a schematic perspective view of a composite electronic component in Preferred Embodiment 1 of the present invention. FIG. 2A and FIG. 2B are schematic section views along the line IIA-IIA and the line IIB-IIB shown in FIG. 1. FIG. 3A and FIG. 3B are a top view and a bottom view of the resistor shown in FIG. 1. Also, FIG. 4 is a view showing an equivalent circuit of the composite electronic component shown in FIG. 1. Referring to FIG. 1 to FIG. 4, a composite electronic component 1A in the present preferred embodiment will be described.

As illustrated in FIG. 1, the composite electronic component 1A of the present preferred embodiment includes a capacitor 10, and a resistor 20A, and preferably has a substantially rectangular parallelepiped shape as a whole. The capacitor is an electronic component containing a capacitor C. The resistor 20A is an electronic component containing a resistor (R).

The capacitor 10 preferably has a rectangular or substantially rectangular parallelepiped shape in which the dimension in the later-described length direction L is larger than the dimension in the later-described width direction W. The rectangular or substantially rectangular parallelepiped shape used herein includes those in which corner portions and ridge portions of the capacitor 10 are rounded, and those in which a step or unevenness is disposed on the outer surface of the capacitor 10.

The resistor 20A preferably has an elongated plate shape in which the dimension in the later-described length direction L is larger than the dimension in the later-described width direction W. The plate shape used herein includes those in which corner portions and ridge portions of the resistor 20A are rounded, and those in which a step or unevenness is provided on the outer surface of the resistor 20A.

The capacitor 10 is disposed on the resistor 20A, and is joined with the resistor 20A via a first and a second joint portions 31, 32 which are, for example, solder joint materials or conductive joint materials such as conductive adhesives. The method for joining the capacitor 10 and the resistor 20A is not limited to the aforementioned joining method using a conductive joint material, and other joining method may be used.

Here, as the terms representing the orientation of the composite electronic component 1A, the direction in which the capacitor 10 and the resistor 20A align is defined as a height direction H, and of the directions perpendicular or substantially perpendicular to the height direction H, the direction in which the later-described capacitor 10 and a first and a second external electrodes 14A, 14B align is defined as a length direction L, and the direction perpendicular or substantially perpendicular to both of the height direction H and the length direction L is defined as a width direction W, and in the following description, these terms are used.

As illustrated in FIG. 1 and FIGS. 2A and 2B, the capacitor 10 is, for example, a multilayer ceramic capacitor, and includes a capacitor body 11, and the first and the second external electrodes 14A, 14B. The capacitor body 11 preferably has a rectangular or substantially rectangular parallelepiped shape, and the first and the second external electrodes 14A, 14B provided on the outer surface thereof including a film are separated from each other.

The capacitor body 11 includes a plurality of dielectric layers 12 and a plurality of internal electrode layers 13 laminated alternately. In the present preferred embodiment, the direction of laminating the plurality of dielectric layers 12 and the plurality of internal electrode layers 13 preferably coincides with the height direction H. The laminating direction may coincide with the width direction W.

The dielectric layers 12 are preferably made of a ceramic material based on barium titanate ($BaTiO_3$), calcium titanate ($CaTiO_3$), strontium titanate ($SrTiO_3$), potassium zirconate ($CaZrO_3$) or the like. The dielectric layers 12 may contain Mn, Mg, Si, Co, Ni, rare earth metal or the like as a secondary component. On the other hand, the internal electrode layers 13 are preferably made of a metal material such as Ni, Cu, Ag, Pd, Ag—Pd alloy, or Au.

Each of the first and the second external electrodes 14A, 14B includes a conductive film, and includes, for example, a multilayer film of a sintered metal layer and a plating layer. The sintered metal layer is formed, for example, by baking a paste of Cu, Ni, Ag, Pd, Ag—Pd alloy, Au or the like. The plating layer is formed of, for example, a Ni plating layer and a Sn plating layer covering the same. The plating layer may be a Cu plating layer or an Au plating layer in place of the same. The first and the second external electrodes 14A, 14B may include only a plating layer, or may include layers obtained by curing a conductive resin paste containing a metal component and a resin component.

The capacitor body 11 includes a pair of end surfaces that are opposite to each other in the length direction L, a pair of lateral surfaces that are opposite to each other in the width direction W, and a pair of principal surfaces that are opposite to each other in the height direction H. Among these, a lower surface 11a which is one of the pair of principal surfaces that is opposite to each other in the height direction H faces the resistor 20A.

The first external electrode 14A is disposed continuously with one end surface of the capacitor body 11, and a portion of each of the pair of lateral surfaces and the pair of principal surfaces, and the second external electrode 14B is disposed continuously with the other end surface of the capacitor body 11, and a portion of each of the pair of lateral surfaces and the pair of principal surfaces. As a result, the lower surface 11a of capacitor body 11 is covered with the first and the second external electrodes 14A, 14B that are separated from each other in the length direction L, and the lower surface 11a of the capacitor body 11 is exposed between the first and the second external electrodes 14A, 14B.

As illustrated in FIGS. 2A and 2B, one of the pair of internal electrode layers 13 adjacent to the dielectric layer 12 interposed therebetween along the height direction H is electrically connected with one of the first and the second external electrodes 14A, 14B inside the capacitor 10, and the other of the internal electrode layers 13 is electrically connected with the other of the first and the second external electrodes 14A, 14B inside the capacitor 10. As a result, between the first and the second external electrodes 14A, 14B, a plurality of capacitors C are electrically connected in parallel.

The capacitor 10 is manufactured, for example, by preparing a plurality of material sheets in which a conductive paste which is to become the internal electrode layers 13 is printed on the surface of a ceramic sheet (so-called green sheet) which is to become the dielectric layers 12, and laminating these plurality of material sheets, and pressure bonding and firing the same to produce the capacitor body 11, and then forming the first and the second external electrodes 14A, 14B on the outer surface of the capacitor body 11. It is also possible to preliminarily produce an assembly in which multiple capacitor bodies 11 are integrated, disassemble the assembly to produce the multiple capacitor bodies 11 collectively, and then form the first and the second external electrodes 14A, 14B on each of the capacitor bodies 11.

As illustrated in FIG. 1 to FIG. 3B, the resistor 20A includes an insulating base portion 21, a resistor 22, a protective film 23, and a first to a fourth upper surface conductors 24A-24D, a first to a fourth lower surface conductors 25A-25D, a first to a fourth via conductors 26A-26D as a first to a fourth connecting conductors, and a first to a fourth lateral surface conductors 27A-27D.

The base portion 21 has a plate shape, and is formed, for example, of a resin material such as epoxy resin, a ceramic material such as alumina, or materials in which a filler or woven fabric formed of an inorganic material or an organic material is added to the resin material or the ceramic material. Preferably, an alumina substrate, or a ceramic substrate including a low temperature co-fired ceramic (LTCC) substrate is used as the base portion 21.

The base portion 21 includes a pair of length directional lateral surfaces that are opposite to each other in the length direction L, a pair of width directional lateral surfaces that are opposite to each other in the width direction W, and a pair of principal surfaces that are opposite to each other in the height direction H. Among these, an upper surface 21a which is one of the pair of principal surfaces faces the capacitor 10, and a lower surface 21b which is the other of the pair of principal surfaces is a mounting surface facing the wiring substrate on which the composite electronic component 1A is mounted.

As illustrated in FIGS. 2A and 2B and FIGS. 3A and 3B, the resistor 22 is disposed at a predetermined position of the upper surface 21a of the base portion 21, and has, for example, a rectangular or substantially rectangular film shape in plan view. As the resistor 22, for example, a metal film, a metal oxide film, a metal glaze film which is a mixture of a metal oxide film and glass, and the like can be used.

The protective film 23 covers at least a portion of the resistor 22 on the upper surface 21a of the base portion 21, and is formed of an insulating film of, for example, a glass material, a resin material or the like. Here, the protective film 23 preferably completely covers the resistor 22 so that the resistor 22 will not be exposed outside.

The first and the second upper surface conductors 24A, 24B are disposed on the upper surface 21a of the base portion 21 and include a rectangular or substantially rectangular conductive film. The first and the second upper surface conductors 24A, 24B are separated from each other in the length direction L, and are disposed in each end portion in the length direction L of the upper surface 21a of the base portion 21.

The third and fourth upper surface conductors 24C, 24D are disposed on the upper surface 21a of the base portion 21, and include a rectangular or substantially rectangular conductive film. The third and fourth upper surface conductors 24C, 24D are located between the first upper surface conductor 24A and the second upper surface conductor 24B in the length direction L. Also, the third and fourth upper surface conductors 24C, 24D are separated from each other in the width direction W, and are disposed in each end portion in the width direction W of the upper surface 21a of the base portion 21.

To make the first to fourth upper surface conductors 24A-24D difficult to peel off from the base portion 21, it is preferred to embed at least a portion of each of the first to fourth upper surface conductors 24A-24D in the base portion 21. In particular, in order to prevent the first and the second upper surface conductors 24A, 24B from peeling off from the base portion 21 by the joint power in joining of the capacitor 10, it is preferred to embed at least a portion of each of the first and the second upper surface conductors 24A, 24B in the base portion 21.

The first and the second lower surface conductors 25A, 25B are disposed on the lower surface 21b of the base portion 21, and include a rectangular or substantially rectangular conductive film. The first and the second lower surface conductors 25A, 25B are separated from each other in the length direction L, and are disposed in each end portion in the length direction L on the lower surface 21b of the base portion 21.

The third and fourth lower surface conductors 25C, 25D are disposed on the lower surface 21b of the base portion 21, and include a rectangular or substantially rectangular conductive film. The third and fourth lower surface conductors 25C, 25D are located between the first lower surface conductor 25A and the second lower surface conductor 25B in the length direction L. The third and fourth lower surface conductors 25C, 25D are separated from each other in the width direction W, and are disposed in each end portion in the width direction W on the lower surface 21b of the base portion 21.

The first and the second via conductors 26A, 26B penetrate the base portion 21 along the height direction H, and preferably have a circular or substantially circular shape in plan view. The first via conductor 26A overlaps the first upper surface conductor 24A and the first lower surface conductor 25A in plan view, and connects the first upper surface conductor 24A and the first lower surface conductor 25A. The second via conductor 26B overlaps the second upper surface conductor 24B and the second lower surface conductor 25B in plan view, and connects the second upper surface conductor 24B and the second lower surface conductor 25B.

The third and fourth via conductors 26C, 26D penetrate the base portion 21 along the height direction H, and have a circular shape in plan view. The third via conductor 26C overlaps the third upper surface conductor 24C and the third lower surface conductor 25C in plan view, and connects the third upper surface conductor 24C and the third lower surface conductor 25C. The fourth via conductor 26D overlaps the fourth upper surface conductor 24D and the fourth lower surface conductor 25D in plan view, and connects the fourth upper surface conductor 24D and the fourth lower surface conductor 25D.

The first lateral surface conductor 27A covers one of the pair of length directional lateral surfaces of the base portion 21 that are opposite to each other in the length direction L, and connects the first upper surface conductor 24A and the first lower surface conductor 25A. The second lateral surface conductor 27B covers the other of the pair of length directional lateral surfaces of the base portion 21 that are opposite to each other in the length direction L, and connects the second upper surface conductor 24B and the second lower surface conductor 25B.

The third lateral surface conductor 27C covers one of the pair of width directional lateral surfaces of the base portion 21 that are opposite to each other in the width direction, and connects the third upper surface conductor 24C and the third lower surface conductor 25C. The fourth lateral surface conductor 27D covers the other of the pair of width directional lateral surfaces of the base portion 21 in the width direction W, and connects the fourth upper surface conductor 24D and the fourth lower surface conductor 25D.

The first to fourth upper surface conductors 24A-24D, the first to fourth lower surface conductors 25A-25D, the first to fourth via conductors 26A-26D, and the first to fourth lateral surface conductors 27A-27D can be formed by using various conductive materials, and preferably formed of a metal material such as Cu, Ni, Sn or the like, by a plating treatment, baking of a conductive paste, sputtering and the like.

Here, the resistor 22 preferably is located between the first upper surface conductor 24A and the second upper surface conductor 24B in the length direction L, and one end thereof in the width direction W covers a portion of the third upper surface conductor 24C and the other end thereof covers a portion of the fourth upper surface conductor 24D. As a result, the third and fourth upper surface conductors 24C, 24D are connected with the resistor 22.

In order to prevent physical interference between the resistor 20A and the capacitor 10, preferably, the dimension in the length direction L of the resistor 22 is set to be smaller than the interval between the first external electrode 14A and the second external electrode 14B of the capacitor 10.

Also, in order to prevent the contact with other conductive member, it is preferred that the protective film 23 covers not only the resistor 22 but also the third and fourth upper surface conductors 24C, 24D. It is not necessarily required that the third and fourth upper surface conductors 24C, 24D are covered with the protective film 23, and only a portion thereof may be covered or the whole thereof may not be covered.

The resistor 20A can be manufactured according to the following procedure.

First, the insulating base portion 21 is prepared, and a through hole is provided in the base portion 21, and a conductive paste is applied to close the through hole, and cured, and thus the first to fourth via conductors 26A-26D are formed.

Next, the first to fourth upper surface conductors 24A-24D and the first to fourth lower surface conductors 25A-25D are formed by printing and baking a conductive paste on the upper surface 21a and the lower surface 21b of the base portion 21, or by forming a film of a metal material by sputtering on the upper surface 21a and the lower surface 21b of the base portion 21.

Thereafter, the first to fourth lateral surface conductors 27A-27D are formed by applying a conductive paste on the pair of length directional lateral surfaces and the pair of width directional lateral surfaces of the base portion 21 and curing the conductive paste, or by forming a plating layer on the pair of length directional lateral surfaces and the pair of width directional lateral surfaces of the base portion 21.

Next, by forming a material that is to be the resistor 22 on the upper surface 21a of the base portion 21 by printing or the like, the resistor 22 is connected with the third and fourth upper surface conductors 24C, 24D.

Thereafter, a glass material, a resin material or the like is applied to the upper surface 21a of the base portion 21 in such a manner that it covers the resistor 22, for example, by printing, and thus the protective film 23 is formed.

In the manner as described above, the resistor 20A is manufactured. The procedure described above is merely illustrative, and it is naturally acceptable to partly change the order of the steps in the aforementioned procedure (for example, the first to fourth upper surface conductors 24A-24D and the first to fourth lower surface conductors 25A-25D are formed first, and then the first to fourth via conductors 26A-26D may be formed), or to form the portions by using a technique other than the aforementioned technique. Also it is possible to preliminarily produce an assembly in which multiple resistors 20A are integrated, and disassemble the assembly to produce the multiple resistor 20A collectively.

Here, as illustrated in FIG. 1 and FIGS. 2A and 2B, in the composite electronic component 1A in the present preferred embodiment, the capacitor 10 and the resistor 20A are joined via the first and the second joint portions 31, 32 as described above.

More specifically, since the capacitor 10 is mounted on the side of the upper surface 21a of the resistor 20A in the height direction H, the lower surface 11a of the capacitor body 11 and the upper surface 21a of the base portion 21 face each other in the height direction H, and the first and the second external electrodes 14A, 14B of the capacitor 10 and the first and the second upper surface conductors 24A, 24B of the resistor 20A are joined via the first and the second joint portions 31, 32 while they are assigned to each other.

As a result, the first and the second external electrodes 14A, 14B and the first and the second upper surface conductors 24A, 24B are electrically connected respectively, and the first and the second upper surface conductors 24A, 24B and the first and the second via conductors 26A, 26B and the first and the second lateral surface conductors 27A, 27B respectively connected thereto, function as a relay conductor of the capacitor 10, and thus the first and the second external electrodes 14A, 14B and the first and the second lower surface conductors 25A, 25B are in such a state that they are electrically connected respectively.

Therefore, the first and the second lower surface conductors 25A, 25B and the first and the second lateral surface conductors 27A, 27B provided in the resistor 20A define and function as a terminal conductor which is a connection terminal to the wiring substrate of the capacitor 10.

On the other hand, since the resister 22 provided in the resistor 20A is electrically connected with the third and fourth upper surface conductors 24C, 24D of the resistor 20A as described above, the third and fourth via conductors 26C, 26D and the third and fourth lateral surface conductors 27C, 27D respectively connected to the third and fourth upper surface conductors 24C, 24D, define and function as a relay conductor of the resistor 22, and thus the third and fourth upper surface conductors 24C, 24D and the third and fourth lower surface conductors 25C, 25D are in such a state that they are electrically connected respectively.

Therefore, the third and fourth lower surface conductors 25C, 25D and the third and fourth lateral surface conductors 27C, 27D provided in the resistor 20A define and function as a terminal conductor which is a connection terminal to the wiring substrate of the resistor 20A.

Thus, the composite electronic component 1A in the present preferred embodiment includes four terminal conductors which are connection terminals to the wiring substrate, and has an equivalent circuit as shown in FIG. 4.

By providing the composite electronic component 1A having the structure as described above, it is not necessary to form a resistor directly on the surface of the capacitor body, and not only is the production process facilitated, but also the electric characteristics of the resistor will not be restricted by the size of the capacitor body and the shape and the size of the pair of external electrodes provided in the capacitor body. Therefore, the degree of freedom in design as a composite electronic component is greatly improved.

Also by providing the composite electronic component 1A with the above-described structure, the capacitor 10 and the resistor 20A to be composited are not necessarily formed into rectangular parallelepipeds of the same shape and the same size, and the electric characteristics of the capacitor 10 and the resistor 20A will not be restricted. Therefore, also in this point, the degree of freedom in design as a composite electronic component is greatly improved.

Further, by providing the composite electronic component 1A with the structure described above, the resistor (R) and the capacitor C will not be in such a state that they are electrically connected in parallel inside the composite electronic component 1A, and thus the degree of freedom in design is very high in the view point of circuit design. In other words, the resistor (R) and capacitor C are able to be electrically connected in series or in parallel on the side of the wiring substrate on which the composite electronic component 1A is mounted, and in some cases, these elements can be connected to separate circuits, respectively. Therefore, a composite electronic component that is applicable to various circuits is achieved.

In addition, by providing the composite electronic component 1A with the above-described structure, the effect of reducing the mounting area achievable by compositing the capacitor 10 and the resistor 20A (higher integration of the electronic components for the wiring substrate) is obtained.

Here, from the view point of reducing the mounting area, it is preferred that the dimension in the length direction L of the capacitor 10 is larger than the dimension in length direction L of the resistor 20A, and the dimension in the width direction W of the capacitor 10 is larger than the dimension in the width direction W of the resistor 20A. Also, from the view point of increasing the capacitance of the capacitor 10, it is preferred that the dimension in the height direction H of the capacitor 10 is larger than the dimension in the height direction H of the resistor 20A.

As described above, in the composite electronic component 1A in the present preferred embodiment and the resistor 20A provided therein, it becomes possible to easily combine the resistor (R) and the capacitor C having desired electric characteristics, and accordingly, it is possible to increase the degree of freedom in design of the circuit design in the wiring substrate on which the composite electronic component is mounted, as well as the degree of freedom in design of the composite electronic component itself.

Here, assuming that a plurality of kinds of elements having different electric characteristics are prepared as the capacitor 10 to be composited, and a plurality of kinds of elements having different electric characteristics are prepared as the resistor 20A to be composited, it is possible to easily produce a composite electronic component including both the resistor (R) and the capacitor C having desired electric characteristics by selecting and appropriately combining these elements. At that time, it is not necessarily required that the shape and the size are made identical among the plurality of kinds of capacitors and among the plurality of kinds of resistors, and the shape and the dimension may be different among the plurality of kinds of capacitors and among the plurality of kinds of resistors as long as the selected kind of capacitor and the selected kind of resistor are able to overlap each other and be composited.

Also in the present preferred embodiment described above, the third upper surface conductor 24C and the fourth upper surface conductor 24D to which the resistor 22 is connected are separated from each other in the width direction W that is perpendicular or substantially perpendicular to the length direction L in which the first upper surface conductor 24A and the second upper surface conductor 24B defining and functioning as a relay conductor of the capacitor 10 align. With such a structure, it becomes possible to increase the area where the resistor 22 is provided on the upper surface 21a of the base portion 21 while increasing the mutual distances between the first to fourth upper surface conductors 24A-D, and to ensure both the insulation between the first to fourth upper surface conductor 24A-D and the degree of freedom of adjustment of electric characteristics of the resistor 22.

Figure 5:
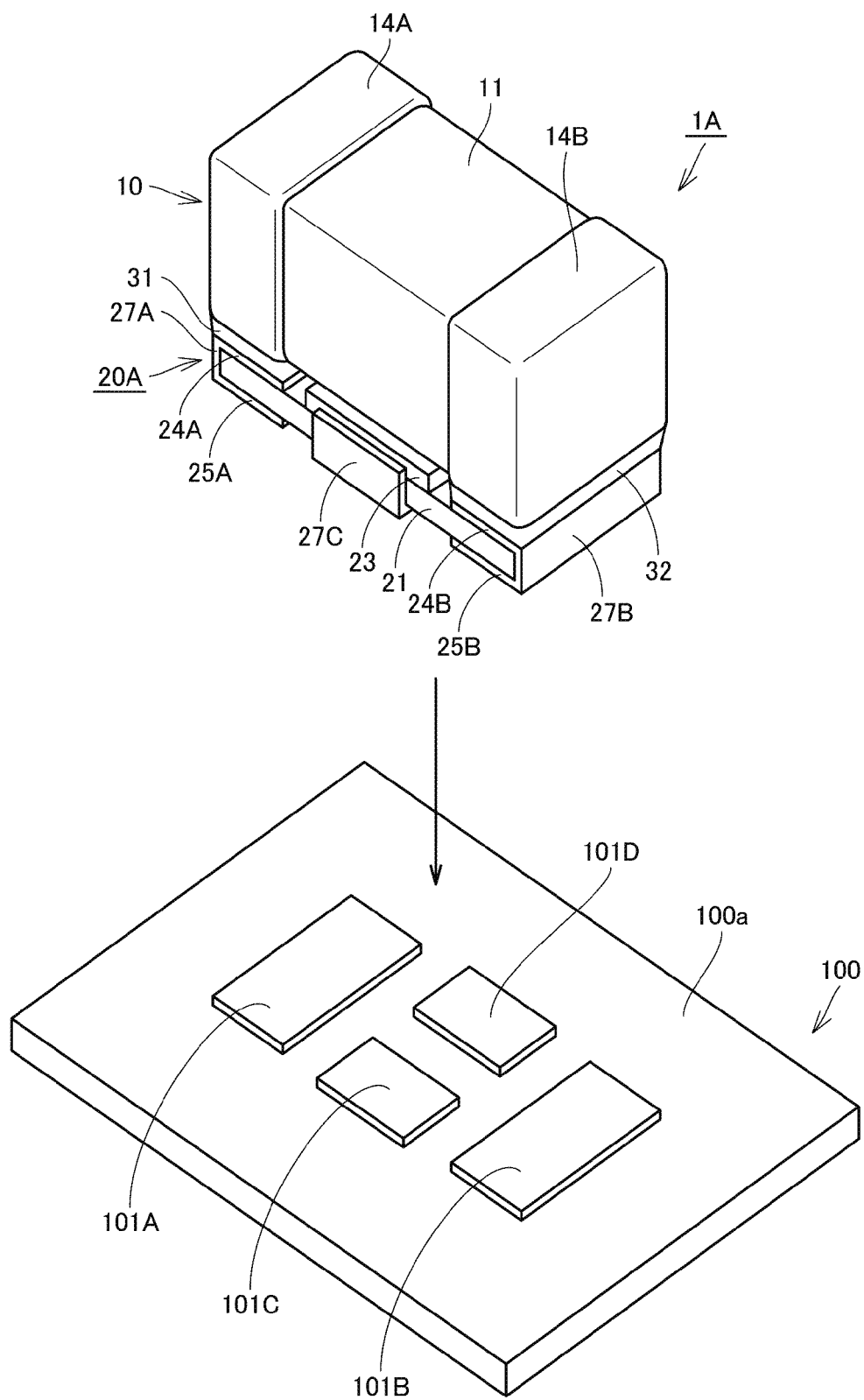
FIG. 5 is a schematic perspective view showing a method for mounting the composite electronic component shown in FIG. 1 on a wiring substrate.
Figure 6A:
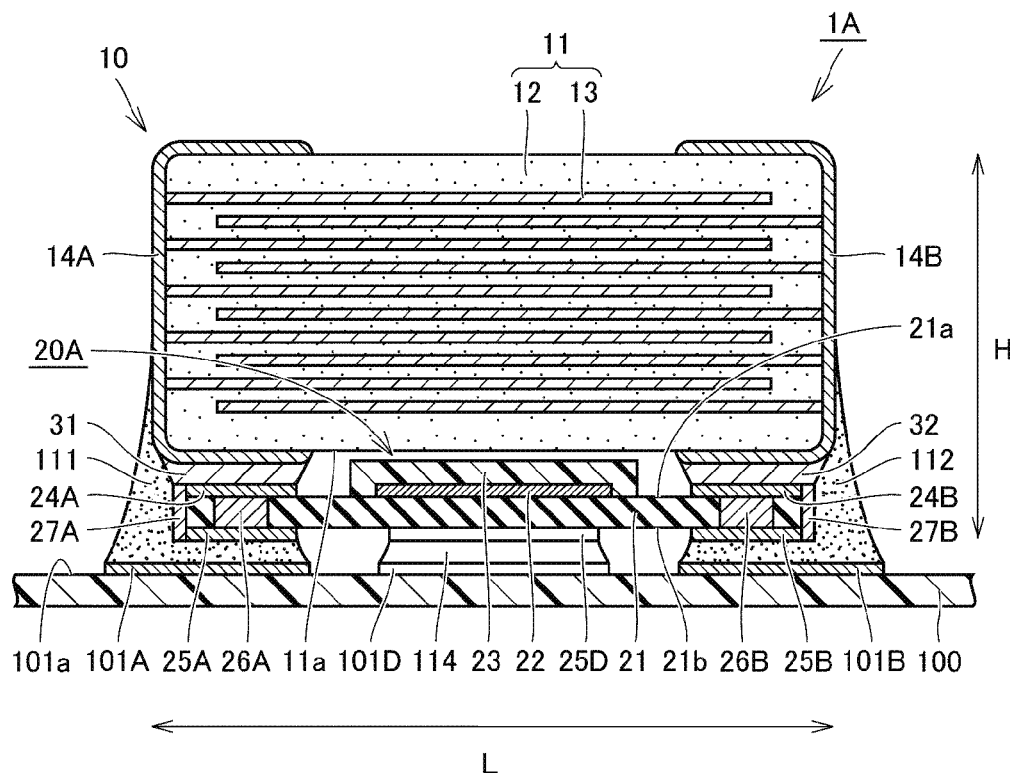
FIGS. 6A and 6B are schematic section views of a mounted structure containing the composite electronic component shown in FIG. 1.
Figure 6B:
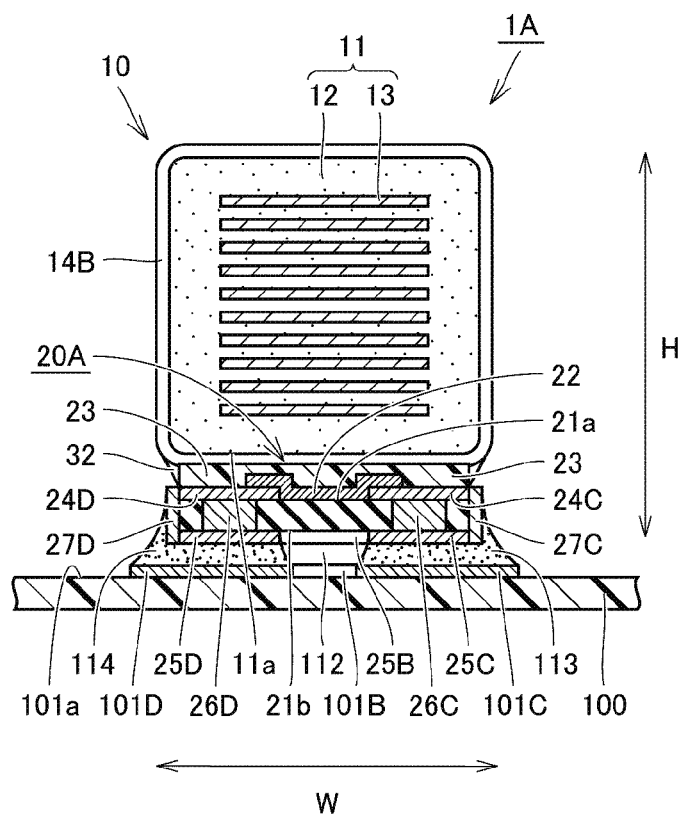

FIG. 5 is a schematic perspective view illustrating a method for mounting the composite electronic component shown in FIG. 1 on the wiring substrate, and FIG. 6A and FIG. 6B are schematic section views of the mounted structure containing the composite electronic component shown in FIG. 1. Referring to FIG. and FIGS. 6A and 6B, a mounted structure of the composite electronic component 1A in the present preferred embodiment on the wiring substrate 100 will be described.

As illustrated in FIG. 5, in mounting the composite electronic component 1A on a wiring substrate 100, the composite electronic component 1A is arranged so that the lower surface 21b of the base portion 21 of the resistor 20A faces a principal surface 100a of the wiring substrate 100, and mounting with the use of a solder joint material or a conductive joint material such a conductive adhesive is conducted.

As illustrated in FIG. 5 and FIGS. 6A and 6B, the wiring substrate 100 is an insulating substrate on which a conductive pattern is provided on the principal surface 100a, and as a material for the wiring substrate 100, a resin material such as epoxy resin, a ceramic material such as alumina, or materials in which a filler or woven fabric formed of an inorganic material or an organic material is added to the resin material or the ceramic material can be used. Generally, as the wiring substrate 100, a glass epoxy substrate in which glass woven fabric is added to a base material of epoxy resin is preferably used.

The principal surface 100a of the wiring substrate 100 is provided with four lands including first to fourth lands 101A-101D in correspondence with the composite electronic component 1A. The four first to the fourth lands 101A-101D each correspond to the conductive pattern as described above, and are disposed while they are separated from each other.

Each of the four first to the fourth lands 101A-101D preferably has a size corresponding to each of the four conductors included in the composite electronic component 1A: the first to fourth lower surface conductors 25A-25D, and contains a portion facing the corresponding one of the first to fourth lower surface conductors 25A-25D along the normal direction of the principal surface 100a of the wiring substrate 100. As a material of the first to fourth lands 101A-101D, diverse conductive materials can be used, and generally, a metal material such as Cu is preferably used.

The four first to fourth lower surface conductors 25A-25D and the first to fourth lateral surface conductors 27A-27D provided in the composite electronic component 1A and the four first to fourth lands 101A-101D provided in the wiring substrate 100 are joined by first to fourth joint portions for mounting 111-114 formed of a conductive joint material, respectively. Here, since the composite electronic component 1A is provided with the first to fourth lateral surface conductors 27A-27D, a fillet of a more appropriate size is formed by the first to fourth joint portions for mounting 111-114, and thus the mounting stability of the composite electronic component 1A increases.

Here, by electrically connecting predetermined lands of the first to fourth lands 101A-101D mutually, it becomes possible to connect the capacitor 10 and the resistor 20A contained in the composite electronic component 1A either in series or in parallel on the side of the wiring substrate 100.

Figure 7A:
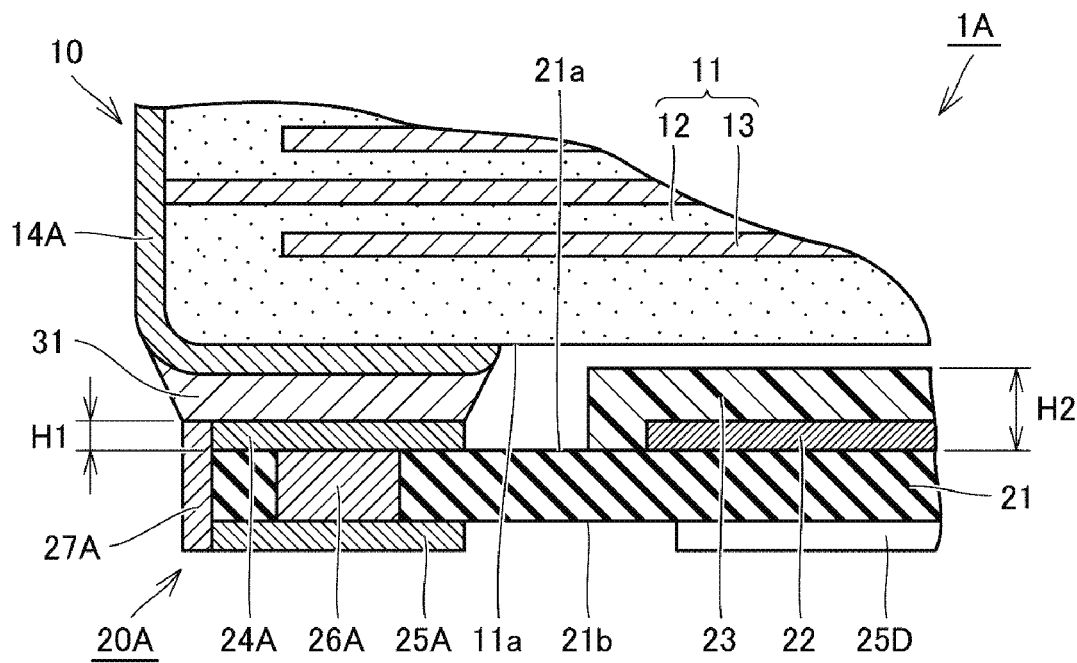
FIGS. 7A and 7B are enlarged section views of the essential portion of the composite electronic component shown in FIG. 1, and an enlarged section view of the essential portion of a composite electronic component according to another exemplary structure based on Preferred Embodiment 1 of the present invention.
Figure 7B:
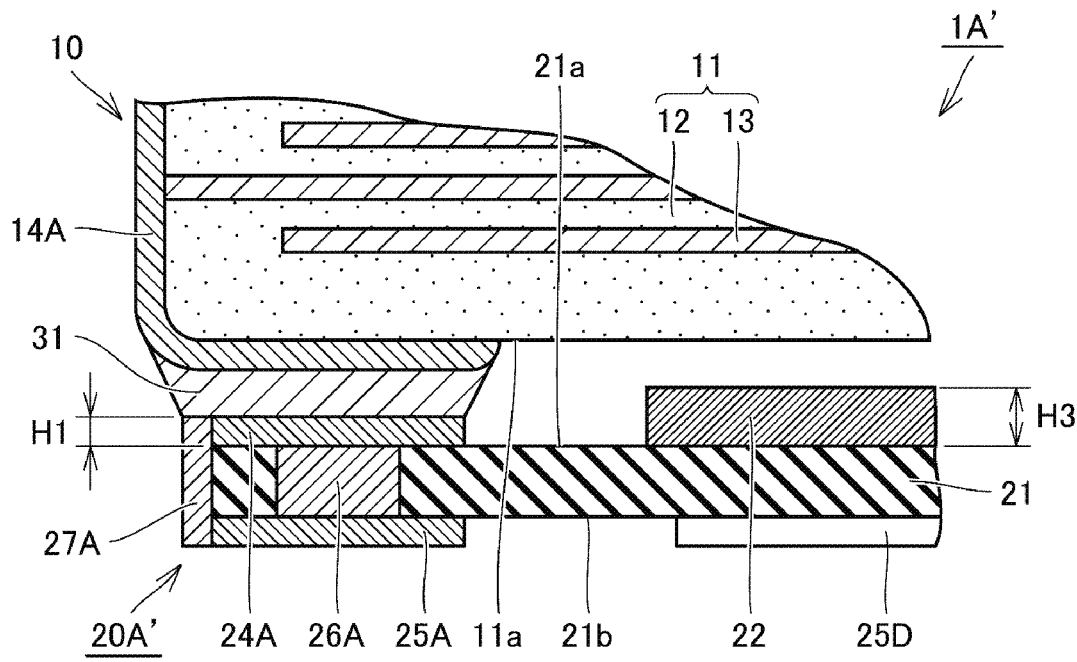

FIG. 7A is an enlarged section view of the essential portion of the composite electronic component in the present preferred embodiment. FIG. 7B is an enlarged section view of the essential portion of the composite electronic component according to another exemplary structure based on the present preferred embodiment.

As illustrated in FIG. 7A, in the composite electronic component 1A in the present preferred embodiment, between the first and the second upper surface conductors 24A, 24B disposed on the upper surface 21a of the base portion 21 of the resistor 20A, and the first and the second external electrodes 14A, 14B disposed on the lower surface 11a of the capacitor body 11 of the capacitor 10, the first and the second joint portions 31, 32 are respectively located.

Therefore, the sum total of the thickness in the height direction H of each of the first and the second upper surface conductors 24A, 24B, the thickness in the height direction H of each of the first and the second external electrodes 14A, 14B in the portion facing the first and the second upper surface conductors 24A, 24B, and the thickness in the height direction H of the first and the second joint portions 31, 32 equals to the distance in the height direction H between the upper surface 21a of base portion 21 and the lower surface 11a of the capacitor body 11.

Here, the resistor 22 and the protective film 23 disposed on the upper surface 21a of the base portion 21 are disposed facing the portion where the capacitor body 11 is exposed on the lower surface 11a of the capacitor body 11.

Therefore, by providing the composite electronic component 1A in the present preferred embodiment, even when a maximum height H1 of the first and the second upper surface conductors 24A, 24B based on the upper surface 21a of the base portion 21 and a maximum height H2 of the protective film 23 satisfy the requirement of H1<H2, the protective film 23 and the resistor 22 will not physically interfere with the capacitor 10 as long as the maximum height H2 is smaller than the distance in the height direction H between the upper surface 21a of the base portion 21 and the lower surface 11a of the capacitor body 11, and hence it is possible to prevent an increase in the outside dimension in the height direction H of the composite electronic component 1A. Preferably, the maximum height H2 is set to be smaller than the sum of the maximum height H1 and the thickness of the first and the second external electrodes 14A, 14B located on the side of the lower surface 11a of the capacitor 10A.

Also as illustrated in FIG. 7B, in a composite electronic component 1A' according to another exemplary structure based on the present preferred embodiment, the resistor 22 is exposed on the upper surface 21a of the base portion 21 rather than being covered with a protective film.

With such a structure, even when the maximum height H1 of the first and the second upper surface conductors 24A, 24B based on the upper surface 21a of the base portion 21 and a maximum height H3 of the resistor 22 satisfy the requirement of H1<H3, the resistor 22 will not physically interfere with the capacitor 10 as long as the maximum height H3 is smaller than the distance in the height direction H between the upper surface 21a of the base portion 21 and the lower surface 11a of the capacitor body 11, and thus it is possible to control and prevent an increase in the outside dimension in the height direction H of the composite electronic component 1A'. Preferably, the maximum height H3 is set to be smaller than the sum of the maximum height H1 and the thickness of the first and the second external electrodes 14A, 14B located on the side of the lower surface 11a of the capacitor 10A.

First Modified Example

Figure 8A:
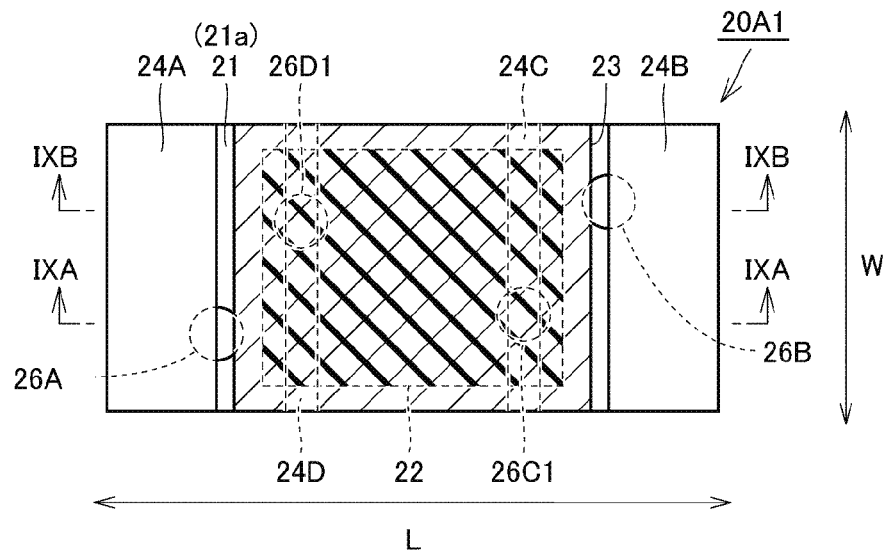
FIGS. 8A-8C include a top view, a section view and a bottom view of a resistor according to a first modified example of a preferred embodiment of the present invention.
Figure 8B:
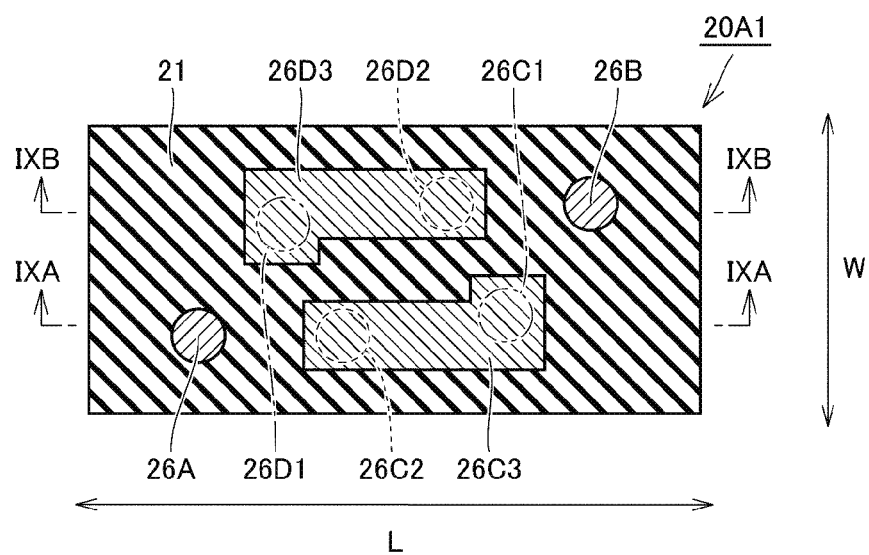
Figure 8C:
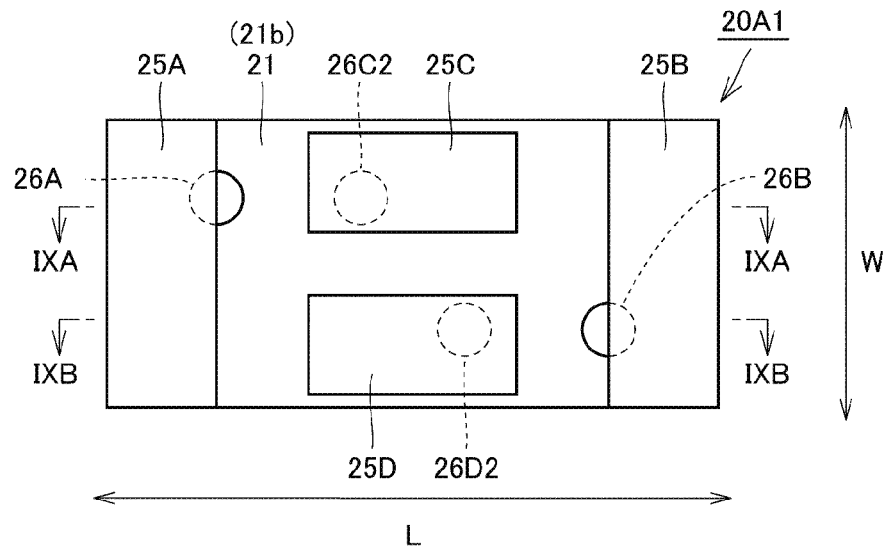
Figure 9A:
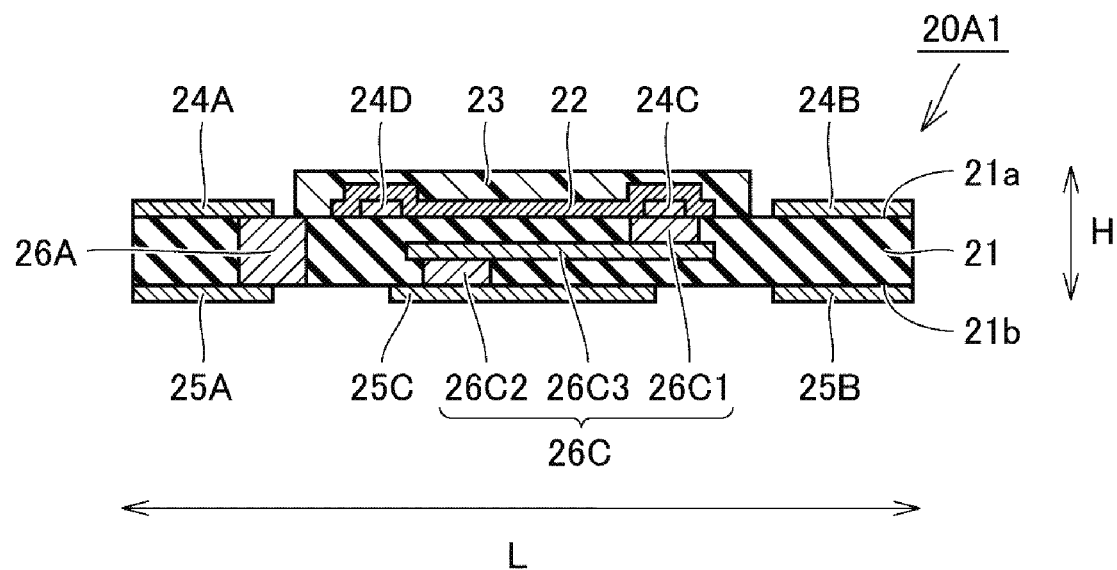
FIGS. 9A and 9B are schematic section views along the line IXA-IXA and the line IXB-IXB shown in FIG. 8.
Figure 9B:
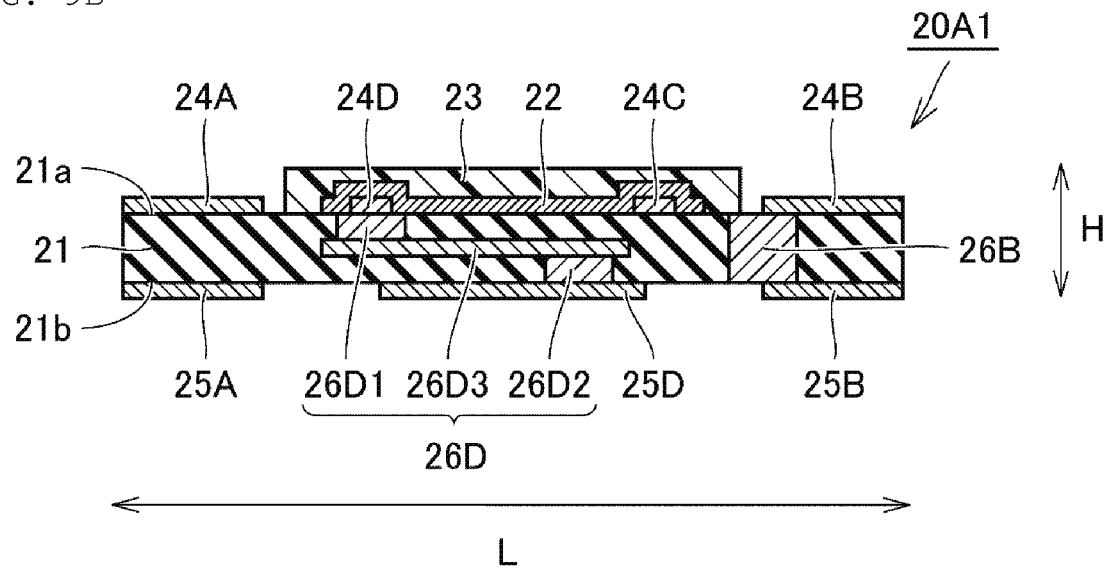

FIGS. 8A to 8C are a top view, a section view and a bottom view of the resistor according to the first modified example. FIG. 9A and FIG. 9B are schematic section views along the line IXA-IXA and the line IXB-IXB shown in FIGS. 8A-8C. Hereinafter, referring to FIGS. 8A-8C and FIGS. 9A and 9B, a resistor 20A1 according to a first modified example of preferred embodiment of the present invention will be described.

As illustrated in FIGS. 8A-8C and FIGS. 9A and 9B, the resistor 20A1 according to the first modified example is different from the aforementioned resistor 20A in layout of elements and portions on the upper surface 21a of the base portion 21 and the lower surface 21b of the base portion 21, and accordingly different in the structure of the first to fourth connecting conductors.

Specifically, the third and fourth upper surface conductors 24C, 24D are located between the first upper surface conductor 24A and the second upper surface conductor 24B in the length direction L, and are separated from each other in the length direction L. Here, each of the third and fourth upper surface conductors 24C, 24D preferably is rectangular or substantially rectangular in plan view, and is elongated along the width direction W. The dimension in the width direction W of the third and fourth upper surface conductors 24C, 24D may be equal to or smaller than that of the first and the second upper surface conductors 24A, 24B.

The resistor 22 is located between the first upper surface conductor 24A and the second upper surface conductor 24B in the length direction L, and one end thereof in the length direction L covers the third upper surface conductor 24C and the other end thereof in the length direction L covers the fourth upper surface conductor 24D. As a result, the third and fourth upper surface conductors 24C, 24D are connected with the resistor 22.

Here in the first modified example, since a larger area of the resistor 22 in a plan view is able to be ensured in comparison with the case of the aforementioned present preferred embodiment, the degree of freedom of adjustment of the electric characteristics of the resistor 22 is further improved.

On the other hand, the third and fourth lower surface conductors 25C, 25D are located between the first lower surface conductor 25A and the second lower surface conductor 25B in the length direction L, and are separated from each other in the width direction W.

In this case, the third upper surface conductor 24C and the third lower surface conductor 25C do not necessarily overlap each other in plan view, and the fourth upper surface conductor 24D and the fourth lower surface conductor 25D do not necessarily overlap each other. In particular, as described above, when the third upper surface conductor 24C and the fourth upper surface conductor 24D are disposed so that they are separated from each other in the length direction L so as to ensure a larger area of the resistor 22, the layout is such that none of these elements overlap each other in plan view.

Therefore, in the resistor 20A1 according to the first modified example, the aforementioned layout is realized by dividing each of the third and fourth via conductors 26C, 26D which are the third and the fourth connecting conductors into multiple portions, and connecting these portions mutually.

That is, in the resistor 20A1 according to the first modified example, the third via conductor 26C connecting the third upper surface conductor 24C and the third lower surface conductor 25C includes an internal connecting conductor 26C3 extending in the direction perpendicular or substantially perpendicular to the height direction H inside the base portion 21, an upper via conductor 26C1 connecting with the internal connecting conductor 26C3, which is located between the upper surface 21a of the base portion 21 and the internal connecting conductor 26C3 and extending in the height direction H, and a lower via conductor 26C2 connecting with the internal connecting conductor 26C3, which is located between the lower surface 21b of the base portion 21 and the internal connecting conductor 26C3 and extending in the height direction H. Here, the upper via conductor 26C1 and the lower via conductor 26C2 do not overlap each other at least partially in plan view.

With such a structure, it becomes possible to connect the third upper surface conductor 24C and the third lower surface conductor 25C via the upper via conductor 26C1, the lower via conductor 26C2 and the internal connecting conductor 26C3 even in such a layout that the third upper surface conductor 24C and the third lower surface conductor 25C do not overlap each other in plan view.

Also, in the resistor 20A1 according to the first modified example, the fourth via conductor 26D connecting the fourth upper surface conductor 24D and the fourth lower surface conductor 25D includes an internal connecting conductor 26D3 extending in the direction perpendicular or substantially perpendicular to the height direction H inside the base portion 21, an upper via conductor 26D1 connecting with the internal connecting conductor 26D3, which is located between the upper surface 21a of the base portion 21 and the internal connecting conductor 26D3 and extending in the height direction H, and a lower via conductor 26D2 connecting with the internal connecting conductor 26D3, which is located between the lower surface 21b of the base portion 21 and the internal connecting conductor 26D3 and extending in the height direction H. Here, the upper via conductor 26D1 and the lower via conductor 26D2 overlap each other at least partially in plan view.

With such a structure, it becomes possible to connect the fourth upper surface conductor 24D and the fourth lower surface conductor 25D via the upper via conductor 26D1, the lower via conductor 26D2 and the internal connecting conductor 26D3 even in such a layout that the fourth upper surface conductor 24D and the fourth lower surface conductor 25D do not overlap each other in plan view.

Therefore, by providing the above-described structure, it is possible to easily differentiate the direction in which the third and fourth upper surface conductors 24C, 24D align, from the direction in which the third and fourth lower surface conductors 25C, 25D align.

As long as it is acceptable in design, it is preferred that the via conductor which is to reach the upper surface or the lower surface of the base portion and to be exposed on the outer surface of the resistor is completely overlapped with the upper surface conductor and the lower surface conductor from the view point of mounting stability and prevention of occurrence of short circuit defects.

In the resistor 20A1 according to the first modified example, any of the first to fourth connecting conductors preferably includes only the first to fourth via conductors 26A-26D, for example.

Here, from the view point of facilitating the process, it is preferred that the first to fourth via conductors 26A-26D provided in the base portion 21 are spaced from the pair of length directional lateral surfaces and the pair of width directional lateral surfaces of the base portion 21 by a predetermined distance (for example, about 50 µm or more), and the diameter of the first to fourth via conductors 26A-26D are relatively large (for example, about 80 µm or more). In that case, by providing the structure of the first modified example, it is possible to prevent an increase in the size of the resistor at a maximum.

While the foregoing illustrates an example in which the upper via conductor and the lower via conductor preferably are connected by using the internal connecting conductor, it is also possible to directly connect the upper via conductor and the lower via conductor rather than providing the internal connecting conductor when the upper via conductor and the lower via conductor are able to be arranged in such a manner that they overlap each other in plan view.

Second Modified Example

Figure 10A:
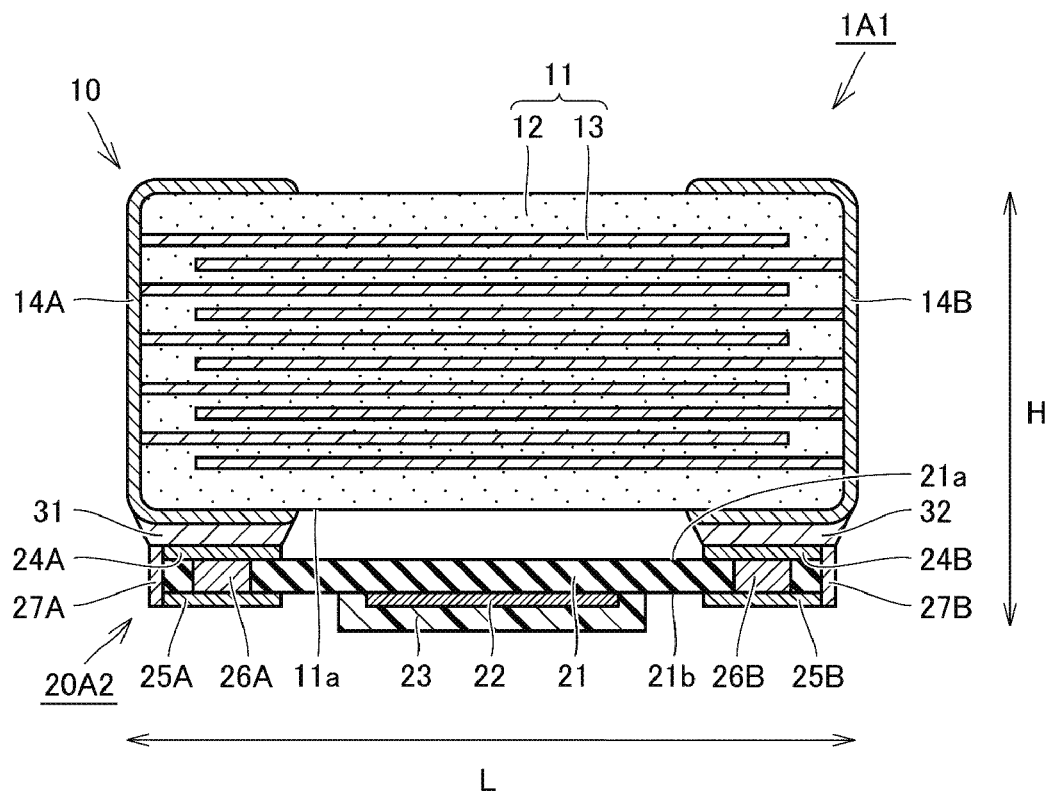
FIGS. 10A and 10B are schematic section views of a composite electronic component according to a second modified example of a preferred embodiment of the present invention.
Figure 10B:
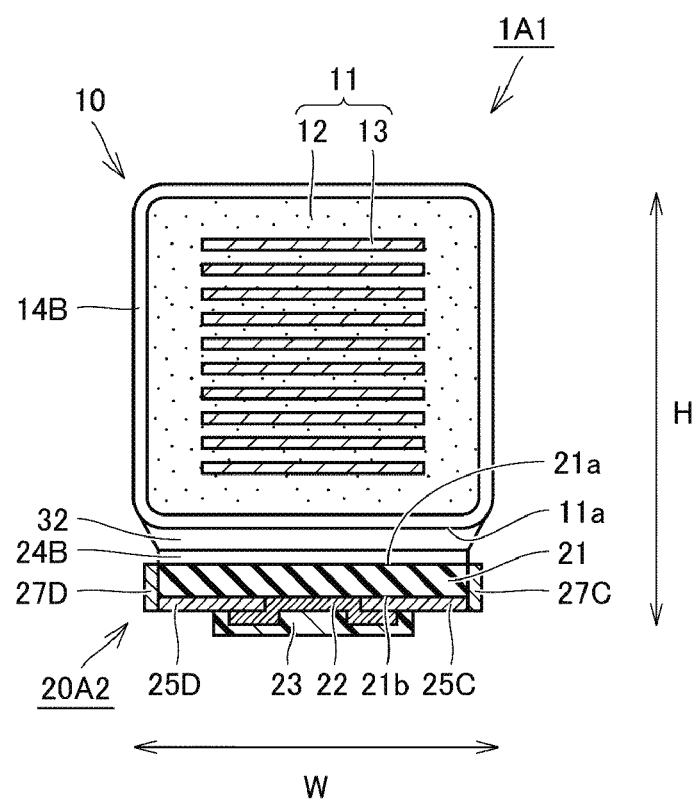

FIG. 10A and FIG. 10B are schematic section views of a composite electronic component according to a second modified example of a preferred embodiment of the present invention. Hereinafter, referring to FIGS. 10A and 10B, a composite electronic component 1A1 according to the second modified example will be described.

As illustrated in FIGS. 10A and 10B, the composite electronic component 1A1 according to the second modified example is different from the aforementioned composite electronic component 1A in that a resistor 20A2 is provided. The resistor 20A2 is different from the aforementioned resistor 20A mainly in the position of the resistor 22 provided in the base portion 21. Specifically, the resistor 22 is disposed on the lower surface of the base portion 21, and is located between the first lower surface conductor 25A and the second lower surface conductor 25B in the length direction L.

Here, regarding the aforementioned resistor 22, one end thereof in the width direction W covers a portion of the third lower surface conductor 25C and the other end thereof in the width direction W covers a portion of the fourth lower surface conductor 25D. As a result, the third and fourth lower surface conductors 25C, 25D are connected with the resistor 22.

While the resistor 20A2 according to the second modified example is not provided with the third and fourth upper surface conductors 24C, 24D and the third and fourth via conductors 26C, 26D that are provided in the aforementioned resistor 20A, these may be provided without causing any problem.

Also with such a structure, the effect similar to the effect described in the aforementioned preferred embodiment is obtained, and it becomes possible to combine the resistor (R) and the capacitor C having desired electric characteristics easily at low costs, and accordingly, it is possible to increase the degree of freedom in design of the circuit design in the wiring substrate on which the composite electronic component is mounted, as well as the degree of freedom in design of the composite electronic component itself.

Third Modified Example

Figure 11A:
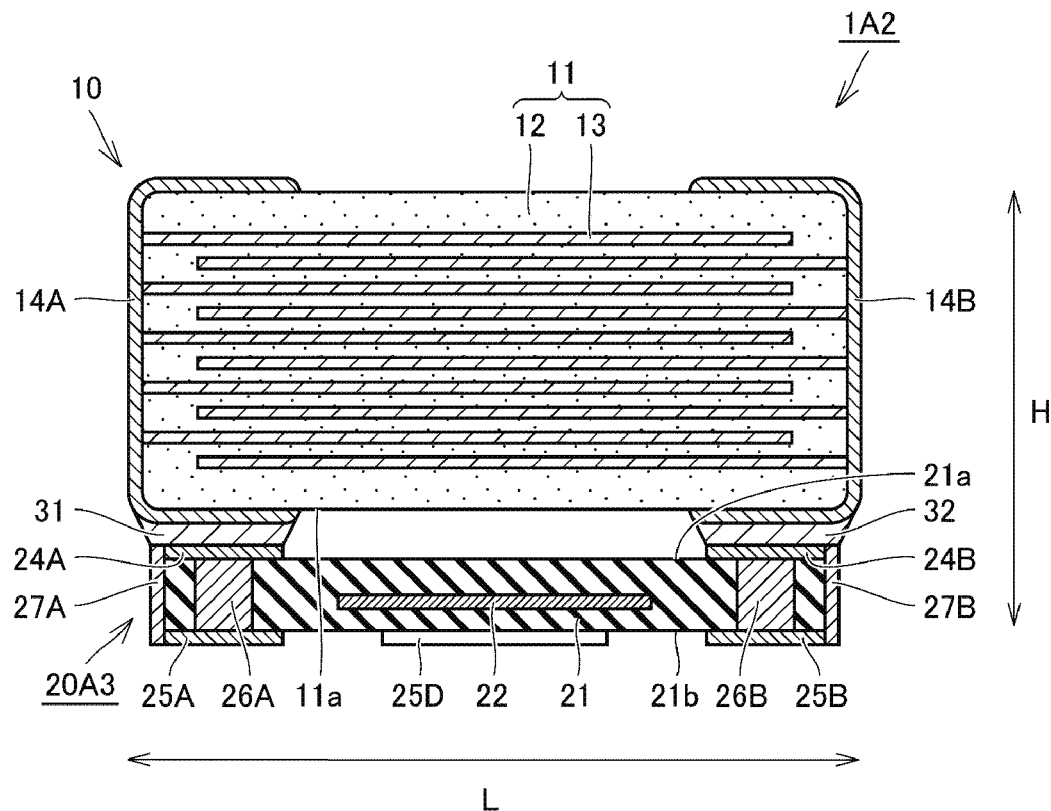
FIGS. 11A and 11B are schematic section views of a composite electronic component according to a third modified example of a preferred embodiment of the present invention.
Figure 11B:
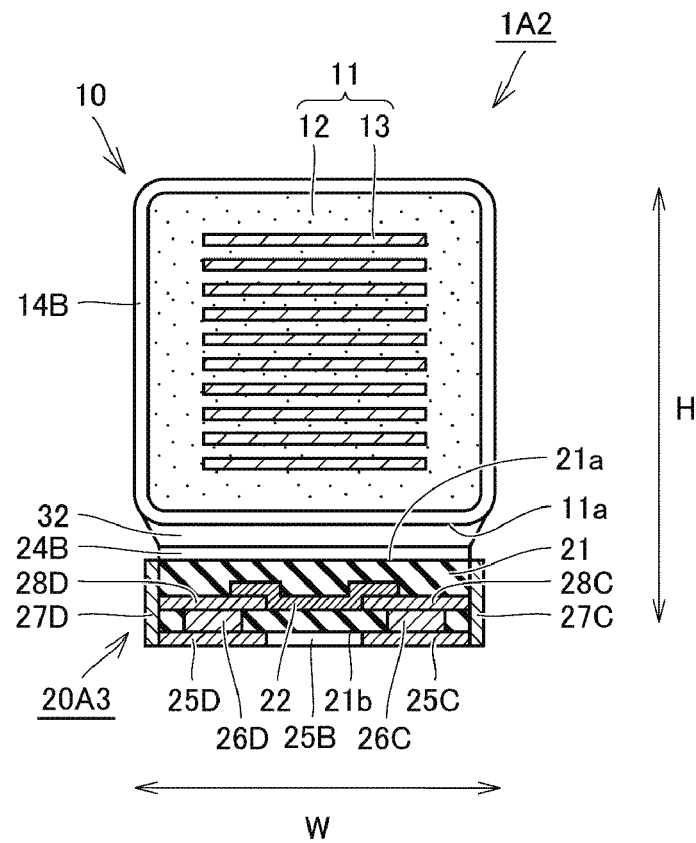

FIG. 11A and FIG. 11B are schematic section views of a composite electronic component according to a third modified example of a preferred embodiment of the present invention. Hereinafter, referring to FIGS. 11A and 11B, a composite electronic component 1A2 according to the third modified example will be described.

As illustrated in FIGS. 11A and 11B, a composite electronic component 1A2 according to the third modified example includes a resistor 20A3 having a structural arrangement that is different from that of the aforementioned composite electronic component 1A. The resistor 20A3 is different from the aforementioned resistor 20A mainly in the position of the resistor 22 provided in the base portion 21. Specifically, the resistor 22 is embedded in the base portion 21, and is located between the first via conductor 26A and the second via conductor 26B in the length direction L.

In association with this, inside the base portion 21, a first and a second internal conductor 28C, 28D located between the first via conductor 26A and the second via conductor 26B in the length direction and separated from each other along the width direction W are provided. The first and the second internal conductors 28C, 28D are disposed in each end portion in the width direction W of the base portion 21.

Here, regarding the aforementioned resistor 22, one end thereof in the width direction W covers a portion of the first internal conductor 28C and the other end thereof in the width direction W covers a portion of the second internal conductor 28D. As a result, the first and the second internal conductors 28C, 28D are connected with the resistor 22.

The third via conductor 26C overlaps the first internal conductor 28C and the third lower surface conductor 25C in plan view, and connects the first internal conductor 28C and the third lower surface conductor 25C. The fourth via conductor 26D overlaps the second internal conductor 28D and the fourth lower surface conductor 25D in plan view, and connects the second internal conductor 28D and the fourth lower surface conductor 25D.

As illustrated in FIGS. 11A and 11B, in the resistor 20A3 according to the third modified example, it is not necessary to provide the third and fourth upper surface conductors 24C, 24D that are provided in the aforementioned resistor 20A.

Also with such a structure, the effect similar to the effect described in the aforementioned preferred embodiment is obtained, and it becomes possible to combine the resistor (R) and the capacitor C having desired electric characteristics easily at low costs, and accordingly, it is possible to increase the degree of freedom in design of the circuit design in the wiring substrate on which the composite electronic component is mounted, as well as the degree of freedom in design of the composite electronic component itself.

Preferred Embodiment 2

Figure 12:
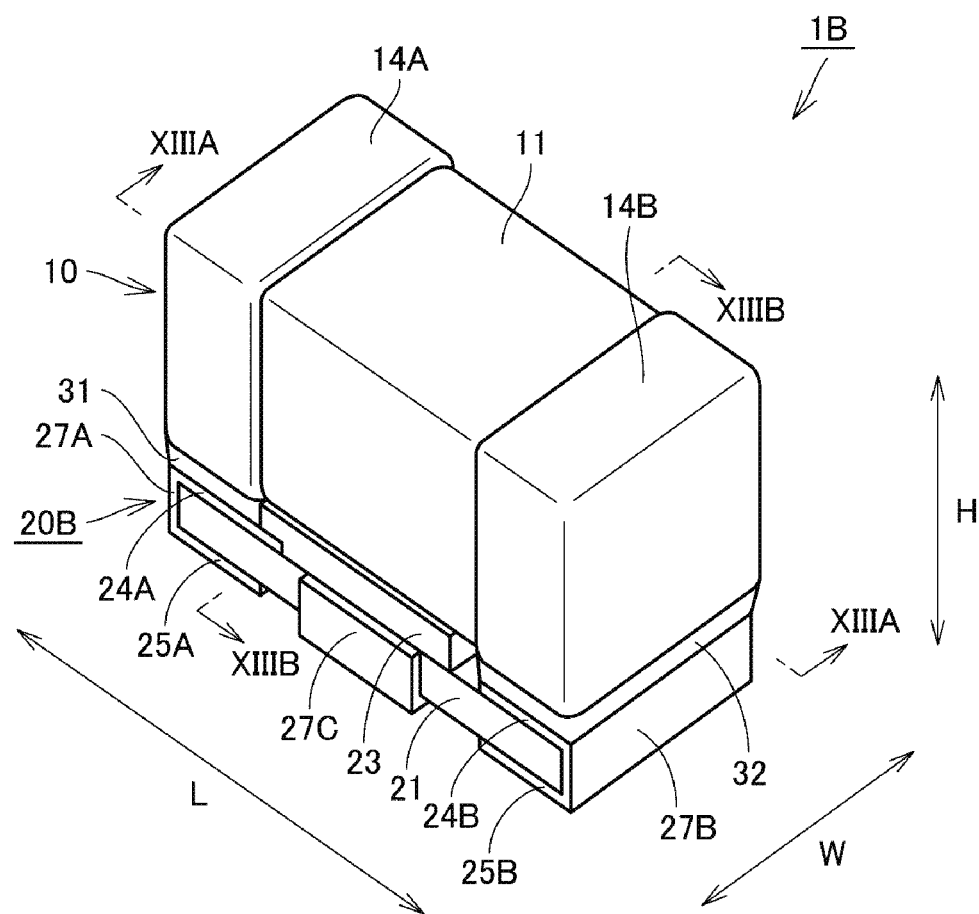
FIG. 12 is a schematic perspective view of a composite electronic component in Preferred Embodiment 2 of the present invention.
Figure 13A:
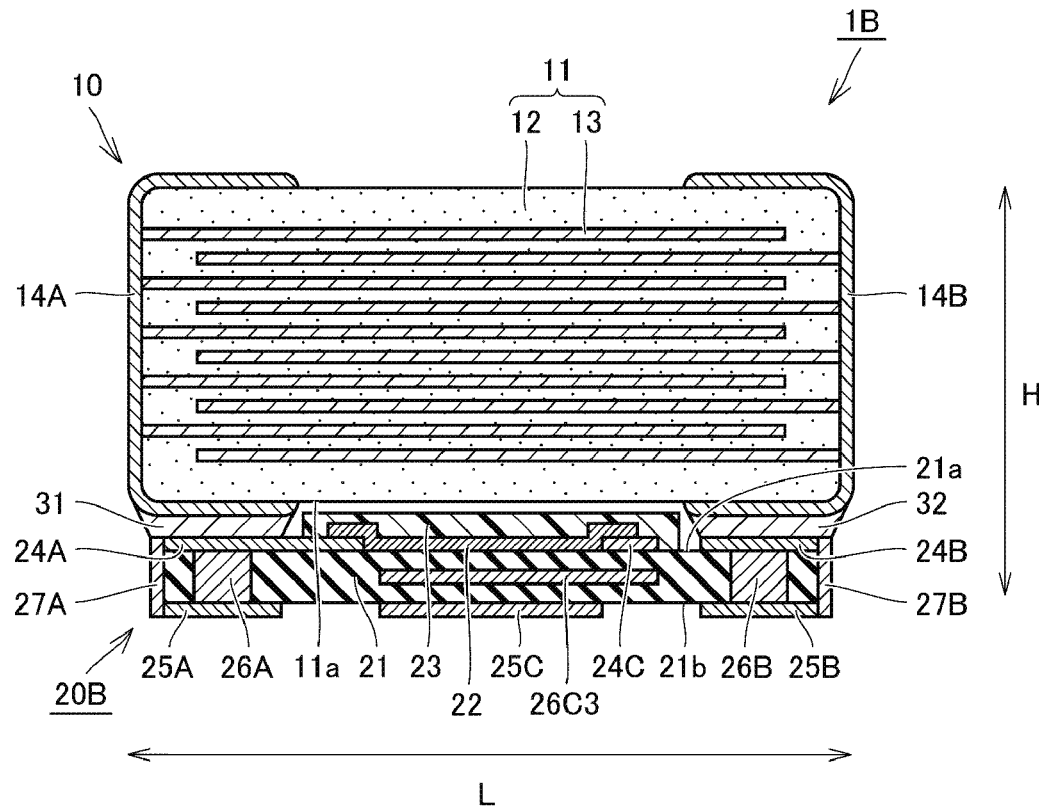
FIGS. 13A and 13B are schematic section views along the line XIIIA-XIIIA and the line XIIIB-XIIIB shown in FIG. 12.
Figure 13B:
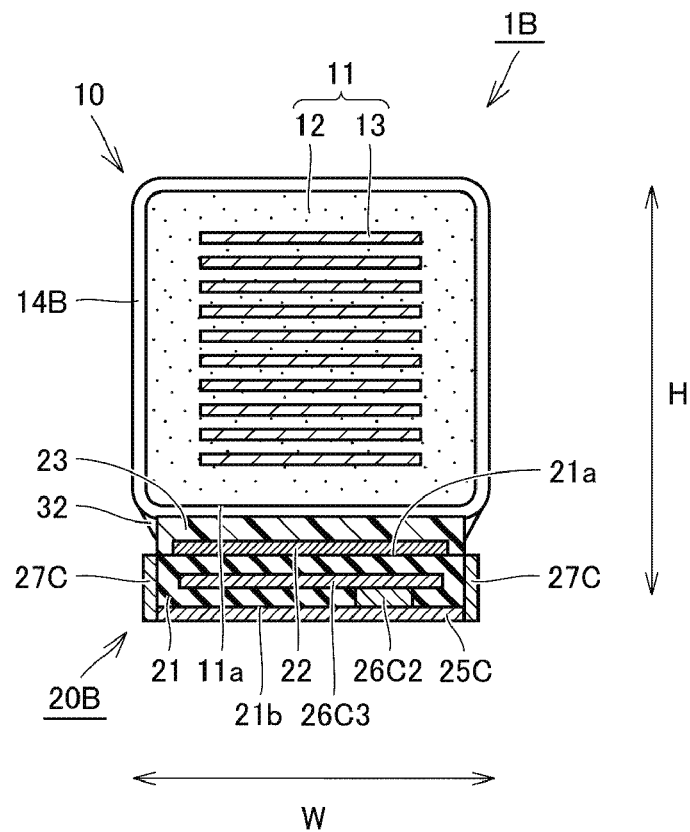
Figure 14A:
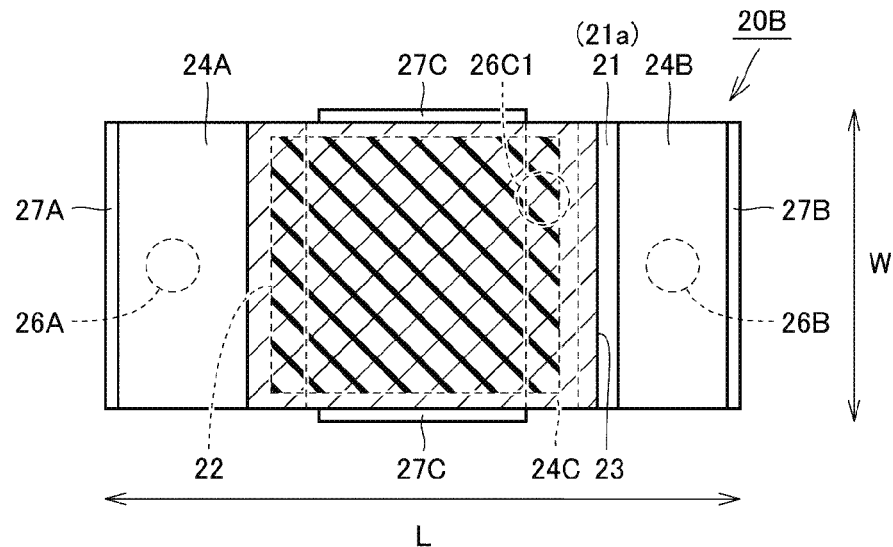
FIGS. 14A, 14B and 14C include a top view, a section view and a bottom view of the resistor shown in FIG. 12.
Figure 14B:
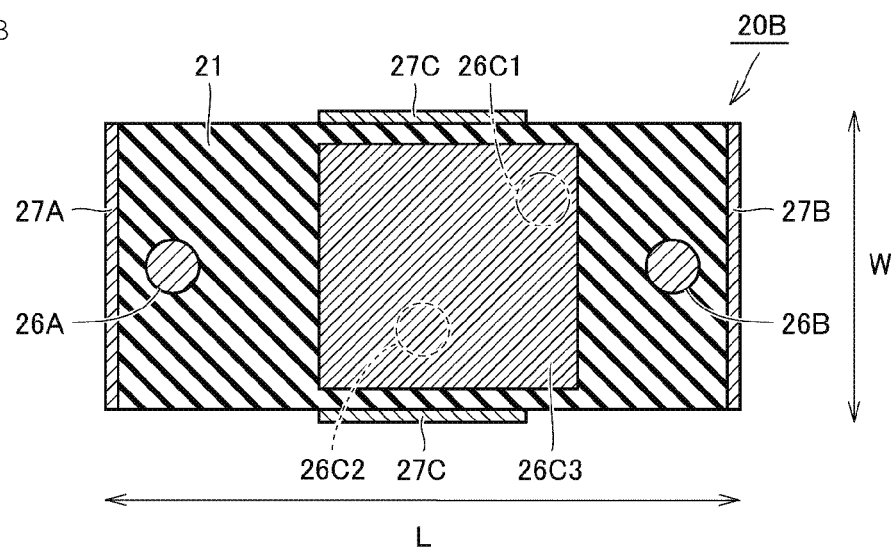
Figure 14C:
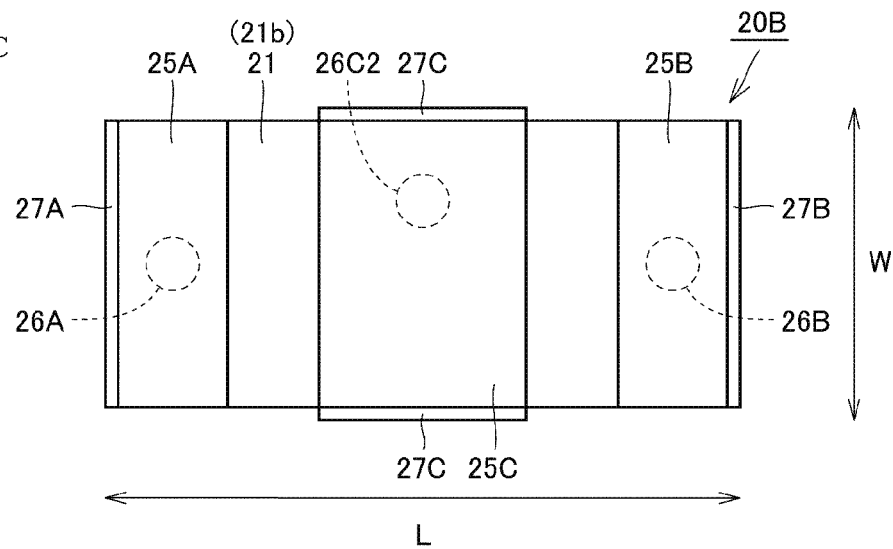
Figure 15:
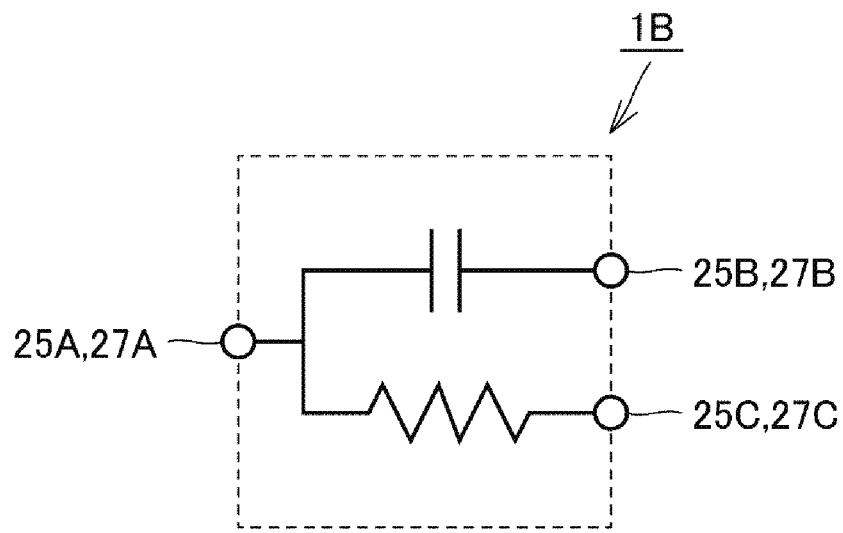
FIG. 15 is a view showing an equivalent circuit of the composite electronic component shown in FIG. 12.

FIG. 12 is a schematic perspective view of a composite electronic component according to Preferred Embodiment 2 of the present invention. FIG. 13A and FIG. 13B are schematic section views along the line XIIIA-XIIIA and the line XIIIB-XIIIB shown in FIG. 12. FIG. 14A to FIG. 14C are a top view, a section view and a bottom view of the resistor shown in FIG. 12. FIG. 15 illustrates an equivalent circuit of the composite electronic component shown in FIG. 12. Hereinafter, referring to FIG. 12 to FIG. 15, a composite electronic component 1B according to the present preferred embodiment will be described.

As illustrated in FIG. 12 to FIG. 14C, the composite electronic component 1B in the present preferred embodiment includes a resistor 20B with a structure different from that of the aforementioned composite electronic component 1A. The resistor 20B is different from the aforementioned resistor 20A mainly in that the fourth upper surface conductor 24D, the fourth lower surface conductor 25D, the fourth via conductor 26D and the fourth lateral surface conductor 27D are not provided.

Specifically, as shown in FIGS. 13A and 13B and FIGS. 14A-14C, the resistor 20B includes only the third upper surface conductor 24C in the portion sandwiched between the first and the second upper surface conductors 24A, 24B in the length direction L on the upper surface 21a of the base portion 21. The third upper surface conductor 24C preferably is rectangular or substantially rectangular in plan view, and elongated along the width direction W. The dimension in the width direction W of the third upper surface conductor 24C may be identical to or smaller than that of the first and the second upper surface conductors 24A, 24B.

Regarding the resistor 22, one end thereof in the length direction L covers a portion of the first upper surface conductor 24A and the other end thereof in the length direction L covers a portion of the third upper surface conductor 24C. As a result, the first and the third upper surface conductors 24A, 24C are connected with the resistor 22.

Here, the third upper surface conductor 24C is provided at the position closer to the second upper surface conductor 24B than the first upper surface conductor 24A. With such a structure, a larger area of the resistor 22 in a plan view is ensured, so that the degree of freedom of adjustment of the electric characteristics of the resistor 22 is further improved.

On the other hand, the third via conductor 26C is located between the first via conductor 26A and the second via conductor 26B in the length direction L, and the third lower surface conductor 25C is located between the first lower surface conductor 25A and the second lower surface conductor 25B in the length direction L.

Here, also in the present preferred embodiment, the third upper surface conductor 24C and the third lower surface conductor 25C do not necessarily overlap each other in plan view. In particular, when the third upper surface conductor 24C is disposed aside the second upper surface conductor 24B as described above so as to further increase the area of the resistor 22, the resultant layout is such that the third upper surface conductor 24C and the third lower surface conductor 25C do not overlap each other in plan view.

Therefore, in the resistor 20B in the present preferred embodiment, the third via conductor 26C connecting the third upper surface conductor 24C and the third lower surface conductor 25C includes an upper via conductor 26C1, a lower via conductor 26C2 and an internal connecting conductor 26C3 that are mutually connected. With such a structure, it becomes possible to connect the third upper surface conductor 24C and the third lower surface conductor 25C even in such a layout that the third upper surface conductor 24C and the third lower surface conductor 25C do not overlap each other.

With such a structure, since the resistor 22 provided in the resistor 20B is electrically connected with the first and the third upper surface conductors 24A, 24C of the resistor 20B, the first and the third via conductors 26A, 26C respectively connected with the first and the third upper surface conductors 24A, 24C and the first and the lateral surface conductors 27A, 27C define and function as a relay conductor of the resistor 22, leading the state that the first and the third upper surface conductors 24A, 24C and the first and the third lower surface conductors 25A, 25C are electrically connected, respectively.

Therefore, the first and the third lower surface conductors 25A, 25C and the first and the third lateral surface conductors 27A, 27C provided in the resistor 20A define and function as a terminal conductor which is a connection terminal to the wiring substrate of the resistor 20B.

In this case, the first upper surface conductor 24A, the first via conductor 26A and the first lateral surface conductor 27A also define and function as a relay conductor of the first external electrode 14A of the capacitor 10, and the first lower surface conductor 25A and the first lateral surface conductor 27A also define and function as a terminal conductor which is a connection terminal to the wiring substrate of the capacitor 10.

As a result, the composite electronic component 1B in the present preferred embodiment includes three terminal conductors which are connection terminals to the wiring substrate, and has an equivalent circuit as shown in FIG. 15.

Also with such a structure, the effect similar to the effect described in the aforementioned Preferred embodiment 1 is obtained, and it becomes possible to easily combine the resistor (R) and the capacitor C having desired electric characteristics, and accordingly, it is possible to increase the degree of freedom in design of the circuit design in the wiring substrate on which the composite electronic component is mounted, as well as the degree of freedom in design of the composite electronic component itself.

When the composite electronic component 1B with the aforementioned structure is provided, the resistor (R) and the capacitor C will not be in such a state that they are electrically connected in parallel inside the composite electronic component 1B, the degree of freedom in design is very high in the view point of circuit design. In other words, the resistor (R) and capacitor C are able to be electrically connected in series or in parallel on the side of the wiring substrate on which the composite electronic component 1B is mounted. Therefore, a composite electronic component that is applicable to various circuits is achieved.

Preferred Embodiment 3

Figure 16:
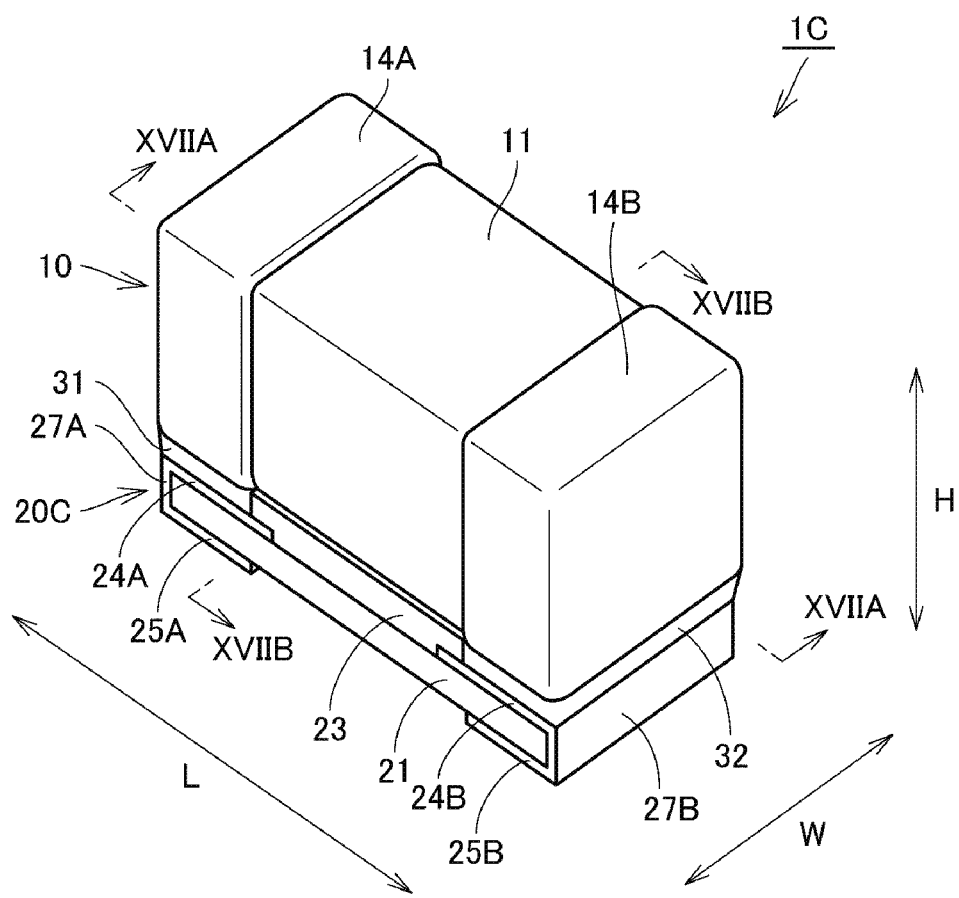
FIG. 16 is a schematic perspective view of a composite electronic component in Preferred Embodiment 3 of the present invention.
Figure 17A:
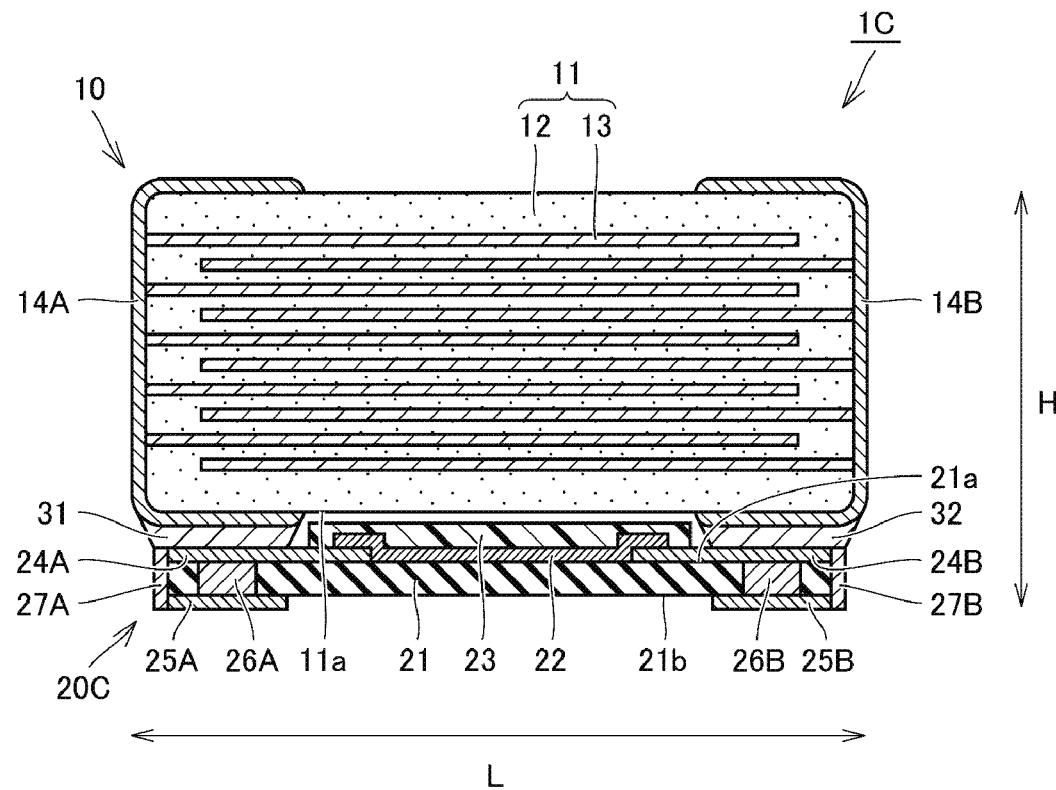
FIGS. 17A and 17B are schematic section views along the line XVIIA-XVIIA and the line XVIIB-XVIIB shown in FIG. 16.
Figure 17B:
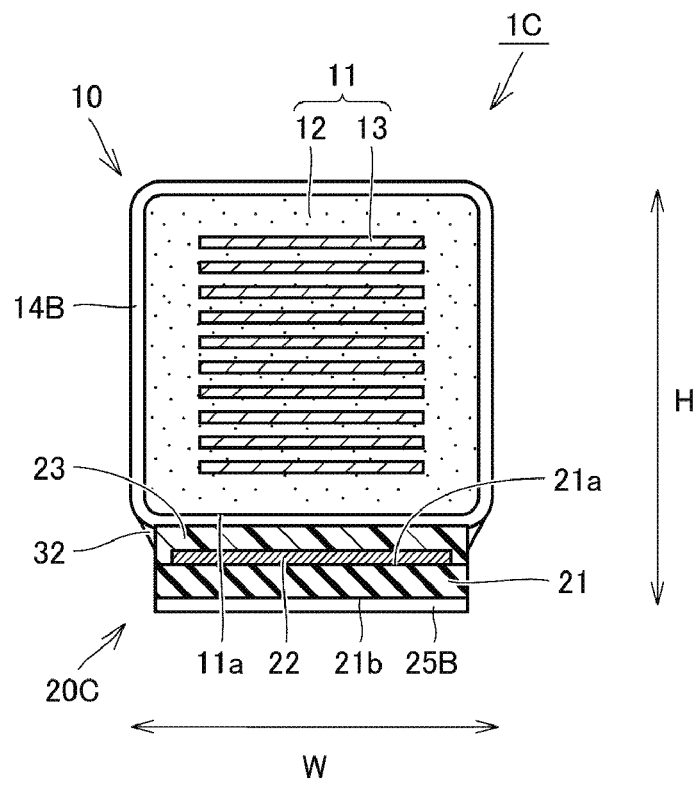
Figure 18A:
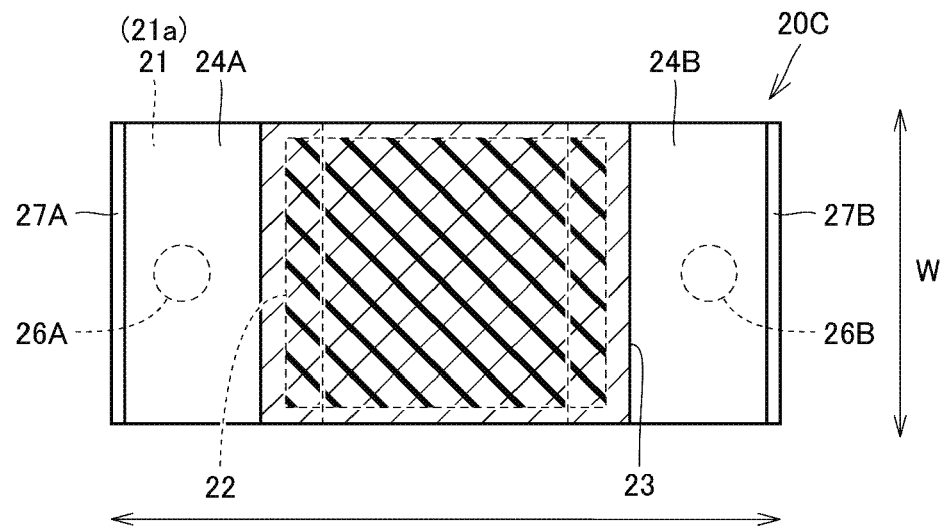
FIGS. 18A and 18B are a top view and a bottom view of the resistor shown in FIG. 16.
Figure 18B:
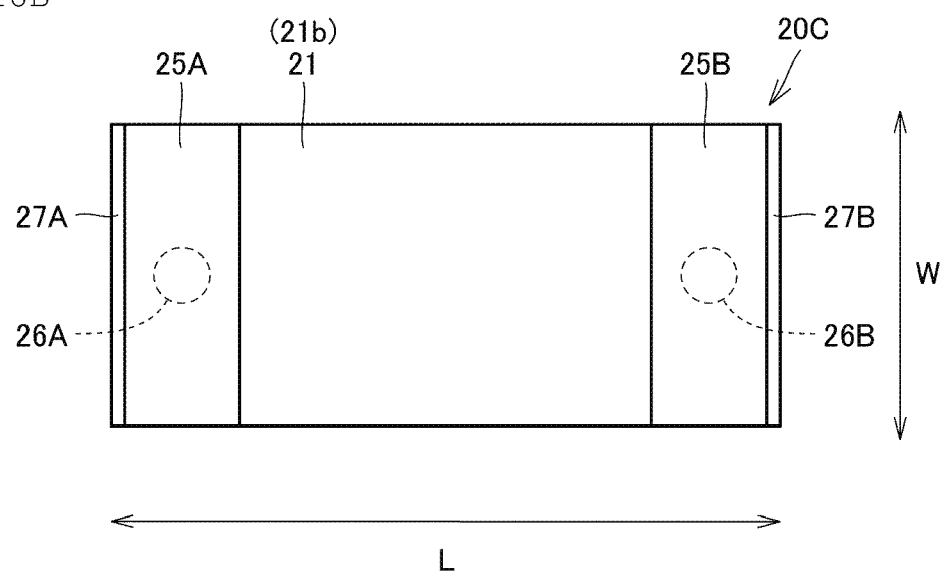
Figure 19:
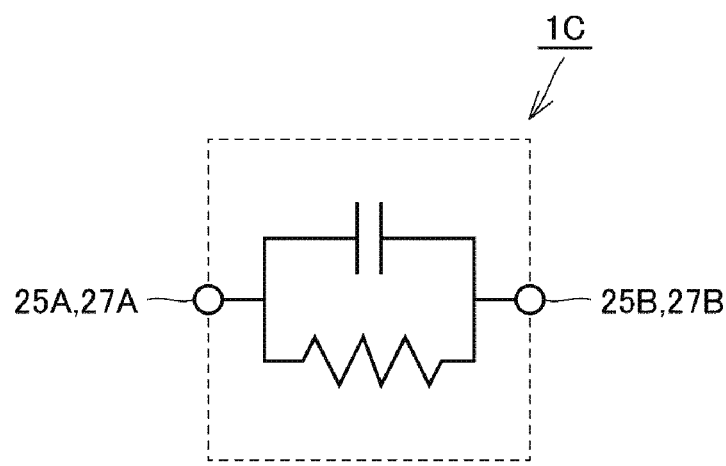
FIG. 19 is a view showing an equivalent circuit of the composite electronic component shown in FIG. 16.

FIG. 16 is a schematic perspective view of a composite electronic component in Preferred Embodiment 3 of the present invention. FIG. 17A and FIG. 17B are schematic section views along the line XVIIA-XVIIA and the line XVIIB-XVIIB shown in FIG. 16. FIG. 18A and FIG. 18B are a top view and a bottom view of the resistor shown in FIG. 16. FIG. 19 illustrates an equivalent circuit of the composite electronic component shown in FIG. 16. Hereinafter, referring to FIG. 16 to FIG. 19, a composite electronic component 1C in the present preferred embodiment will be described.

As illustrated in FIG. 16 to FIG. 18B, the composite electronic component 1C in the present preferred embodiment includes a resistor 20C with a structure different from that of the aforementioned composite electronic component 1A. The resistor 20C is different from the aforementioned resistor 20A mainly in that the third and fourth upper surface conductors 24C, 24D, the third and fourth lower surface conductors 25C, 25D, the third and fourth via conductors 26C, 26D and the third and fourth lateral surface conductors 27C, 27D are not provided.

Specifically, as shown in FIG. 17 and FIGS. 18A and 18B, the resistor 20C does not include any other conductor in the portion sandwiched between the first and the second upper surface conductors 24A, 24B in the length direction L on the upper surface 21a of the base portion 21. Also, the resistor 20C does not include any other conductor in the portion sandwiched between the first and the second lower surface conductors 25A, 25B in the length direction L on the lower surface 21b of the base portion 21.

Regarding the resistor 22, one end thereof in the length direction L covers a portion of the first upper surface conductor 24A and the other end thereof in the length direction L covers a portion of the second upper surface conductor 24B. As a result, the first and the second upper surface conductors 24A, 24B are connected with the resistor 22.

With such a structure, since the resistor 22 provided in the resistor 20C is electrically connected with the first and the second upper surface conductors 24A, 24B of the resistor 20C, the first and the second via conductors 26A, 26B respectively connected with the first and the second upper surface conductors 24A, 24B and the first and the second lateral surface conductors 27A, 27B define and function as a relay conductor of the resistor 22, leading the state that the first and the second upper surface conductors 24A, 24B and the first and the second lower surface conductors 25A, 25B are electrically connected, respectively.

Therefore, the first and the second lower surface conductors 25A, 25B and the first and the second lateral surface conductors 27A, 27B provided in the resistor 20C define and function as a terminal conductor which is a connection terminal to the wiring substrate of the resistor 20C.

In this case, the first and the second upper surface conductors 24A, 24B, the first and the second via conductors 26A, 26B and the first and the second lateral surface conductors 27A, 27B also define and function as a relay conductor of the capacitor 10, and the first and the second lower surface conductors 25A, 25B and the first and the second lateral surface conductors 27A, 27B also define and function as a terminal conductor which is a connection terminal to the wiring substrate of the capacitor 10.

As a result, the composite electronic component 10 in the present preferred embodiment includes two terminal conductors which are connection terminals to the wiring substrate, and has an equivalent circuit as shown in FIG. 19.

Also with such a structure, the effect similar to the effect described in the aforementioned Preferred Embodiment 1 is obtained, and it becomes possible to easily combine the resistor (R) and the capacitor C having desired electric characteristics, and accordingly, it is possible to increase the degree of freedom in design of the composite electronic component itself.

In the aforementioned preferred embodiments and modified examples thereof according to the present invention, while the description was made by mainly illustrating an example in which the conductor disposed on the upper surface of the base portion of the resistor and the conductor disposed on the lower surface preferably are connected by both of the via conductor and the lateral surface conductor, it is not necessarily required to provide both the via conductor and the lateral surface conductor, and either one may be provided.

Also, in the aforementioned preferred embodiments and modified examples thereof according to the present invention, while the description was made by illustrating an example in which the direction of lamination of the dielectric layers and the internal electrode layers of the capacitor body of the capacitor preferably is coincident with the height direction of the composite electronic component, it is naturally possible to provide a structure such that the direction of lamination is coincident with the width direction of the composite electronic component.

Also, in the aforementioned preferred embodiments and modified examples thereof according to the present invention, while the description was made by illustrating an example in which a multilayer ceramic capacitor preferably is used as the capacitor to be incorporated into the composite electronic component, it is also possible to incorporate other kinds of capacitors into the composite electronic component in place of the multilayer ceramic capacitor.

Also, in the aforementioned preferred embodiments and modified examples thereof according to the present invention, while the description was made by illustrating an example in which a multilayer ceramic capacitor preferably is used as an electronic component mounted on the resistor, the electronic component mounted on the resistor may be a capacitor other than the multilayer ceramic capacitor, or may be another electronic component such as an inductor element, a thermistor element, and a piezoelectric element. Here, the inductor element is different from the aforementioned multilayer ceramic capacitor in that a coiled conductive layer in place of the internal electrode layer is provided in the body, and a pair of external terminals of the coiled conductor layer in place of the pair of external electrode are disposed on the surface of the body.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component comprising: a resistor; and
    a capacitor mounted on the resistor in a height direction; wherein the resistor includes:
    an insulating base portion including an upper surface and a lower surface that are opposite to each other in the height direction;
    a resistor element provided on the base portion;
    a plurality of upper surface conductors disposed on the upper surface of the base portion, and a plurality of lower surface conductors disposed on the lower surface of the base portion;
    a first upper surface conductor and a second upper surface conductor of the plurality of upper surface conductors disposed on the upper surface of the base portion so as to be separated from each other in a length direction perpendicular or substantially perpendicular to the height direction;
    a first lower surface conductor and a second lower surface conductor of the plurality of lower surface conductors disposed on the lower surface of the base portion so as to be separated from each other in the length direction;
    a first connecting conductor connecting the first upper surface conductor and the first lower surface conductor; and
    a second connecting conductor connecting the second upper surface conductor and the second lower surface conductor; the capacitor includes:
    a capacitor body including a lower surface intersecting the height direction; and
    a first external electrode and a second external electrode disposed on an outer surface of the capacitor body so as to be separated from each other in the length direction;
    the upper surface of the base portion and the lower surface of the capacitor body facing each other in the height direction, the first upper surface conductor and the first external electrode being electrically connected, the second upper surface conductor and the second external electrode being electrically connected; and
    at least one of the plurality of upper surface conductors and the plurality of lower surface conductors is not physically or mechanically connected to the first external electrode and the second external electrode disposed on the outer surface of the capacitor body.

2. The composite electronic component according to claim 1, wherein
    the resistor element is disposed on the lower surface of the base portion, and is located between the first lower surface conductor and the second lower surface conductor in the length direction;
    the plurality of lower surface conductors include a third lower surface conductor and a fourth lower surface conductor disposed on the lower surface of the base portion, located between the first lower surface conductor and the second lower surface conductor in the length direction so as to be separated from each other; and
    the third lower surface conductor and the fourth lower surface conductor are connected by the resistor element.

3. The composite electronic component according to claim 2, wherein the third lower surface conductor and the fourth lower surface conductor are separated from each other in a width direction that is perpendicular or substantially perpendicular to the height direction and the length direction.

4. The composite electronic component according to claim 2, further comprising a protective film that covers the resistor element.

* * * * *